(12) United States Patent
Matsui et al.

(10) Patent No.: US 7,679,080 B2
(45) Date of Patent: Mar. 16, 2010

(54) FUNCTIONAL MOLECULAR DEVICE

(75) Inventors: Eriko Matsui, Kanagawa (JP);
Nobuyuki Matsuzawa, Tokyo (JP);
Akio Yasuda, Stuttgart (DE); Oliver Harnack, Stuttgart (DE)

(73) Assignees: Sony Corporation, Tokyo (JP); Sony Deutschland G.m.b.H., Cologne (DE)

( * ) Notice: Subject to any disclaimer, the term of this patent is extended or adjusted under 35 U.S.C. 154(b) by 717 days.

(21) Appl. No.: 11/571,135

(22) PCT Filed: Jun. 23, 2005

(86) PCT No.: PCT/JP2005/011499

§ 371 (c)(1),
(2), (4) Date: Dec. 27, 2006

(87) PCT Pub. No.: WO2006/001321

PCT Pub. Date: Jan. 5, 2006

(65) Prior Publication Data
US 2009/0159873 A1   Jun. 25, 2009

(30) Foreign Application Priority Data
Jun. 23, 2004  (JP)  .............................. 2004-184589

(51) Int. Cl.
*H01L 51/30*  (2006.01)

(52) U.S. Cl. .......... 257/40; 257/E51.023; 257/E51.024; 365/151; 977/731; 977/791; 977/940; 977/943

(58) Field of Classification Search .................. 257/40, 257/E51.023, E51.024; 365/151; 977/731, 977/791, 938, 940, 943
See application file for complete search history.

(56) References Cited

U.S. PATENT DOCUMENTS 6,128,214 A  10/2000  Kuekes et al.
6,256,767 B1  7/2001  Kuekes et al.

2001/0044552 A1  11/2001  Fukushima et al.
2002/0075420 A1  6/2002  Zhang et al.
2004/0013345 A1  1/2004  Zhang et al.

FOREIGN PATENT DOCUMENTS

JP  2001-316354  11/2001

(Continued)

OTHER PUBLICATIONS

Chen et al., "Large On-Off Ratios and Negative Differential resistance in a Molecular Electronic Device," Science, Nov. 19, 1999, vol. 286, pp. 1550-1552.

(Continued)

*Primary Examiner*—Steven Loke
*Assistant Examiner*—Arman Khosraviani
(74) *Attorney, Agent, or Firm*—K&L Gates LLP

(57) ABSTRACT

A functional molecular device displaying its functions under the action of an electrical field is provided. A Louis base molecule, exhibiting positive dielectric constant anisotropy or exhibiting dipole moment along the long-axis direction of the Louis base molecule, is arrayed in the form of a pendant on an electrically conductive linear or film-shaped principal-axis molecule of a conjugated system, via a metal ion capable of acting as a Louis acid. The resulting structure is changed in conformation on application of an electrical field to exhibit its function. The electrically conductive linear or film-shaped principal-axis molecule and the Louis base molecule form a complex with the metal ion. On application of the electrical field, the Louis base molecule performs a swinging movement or a seesaw movement to switch the electrical conductivity of the principal-axis molecule. This molecule exhibits electrical characteristics which may be reversed depending on whether or not the molecule has been subjected to electrical field processing. A molecular device having a function equivalent to one of CMOS may be produced from one and the same material.

17 Claims, 24 Drawing Sheets

FOREIGN PATENT DOCUMENTS

| | | | | |
|---|---|---|---|---|
| JP | 2003-209305 | | 7/2003 | |
| JP | 2003-218360 | | 7/2003 | |
| WO | WO 2004/059756 | * | 7/2004 | ............ 257/40 |

OTHER PUBLICATIONS

Reed et al., "Conductance of a Molecular Junction," Science, Oct. 10, 1997, vol. 278, pp. 252-254.

Trzaska et al., "Cooperative Chirality in Columnar Liquid Crystals: Studies of Fluxional Octahedral Metallomesogens," J. Am. Chem. Soc. 1999, vol. 121, pp. 2418-4519.

Jeandon et al., "Biladienones from the Photooxidation of a meso-gem-Disubstituted Phlorin: Crystal and Molecular Structures of the 3N+O Coordinated Nickel(II) and Copper(II) Complexes," Inorg. Chem. 2001, vol. 40, pp. 3149-3153.

Spasojevie et al., "Managanese(III) Billiverdin IX Dimethyl Ester: A Powerful Catalytic Scavenger of Superoxide Employing the Mn(III)/Mn(IV) Redox Couple," Inorg. Chem., 2001, vol. 40, pp. 726-739.

Mizutani et al., "Interconversion between Point Chirality and Helical Chirality Driven by Shape-Sensitive Interactions," J. Am. Chem. Soc. 1996, vol. 118, pp. 5318-5319.

Mizutani et al., "Helical Chirality Induction by Point Chirality at Helix Terminal," J. Am. Chem. Soc., 1999, vol. 121, pp. 754-759.

Mizutani et al., "Allosteric Chirality Amplification in Zinc Billinone Dimer," J. Am. Chem. Soc., 2000, vol. 122, pp. 748-749.

* cited by examiner

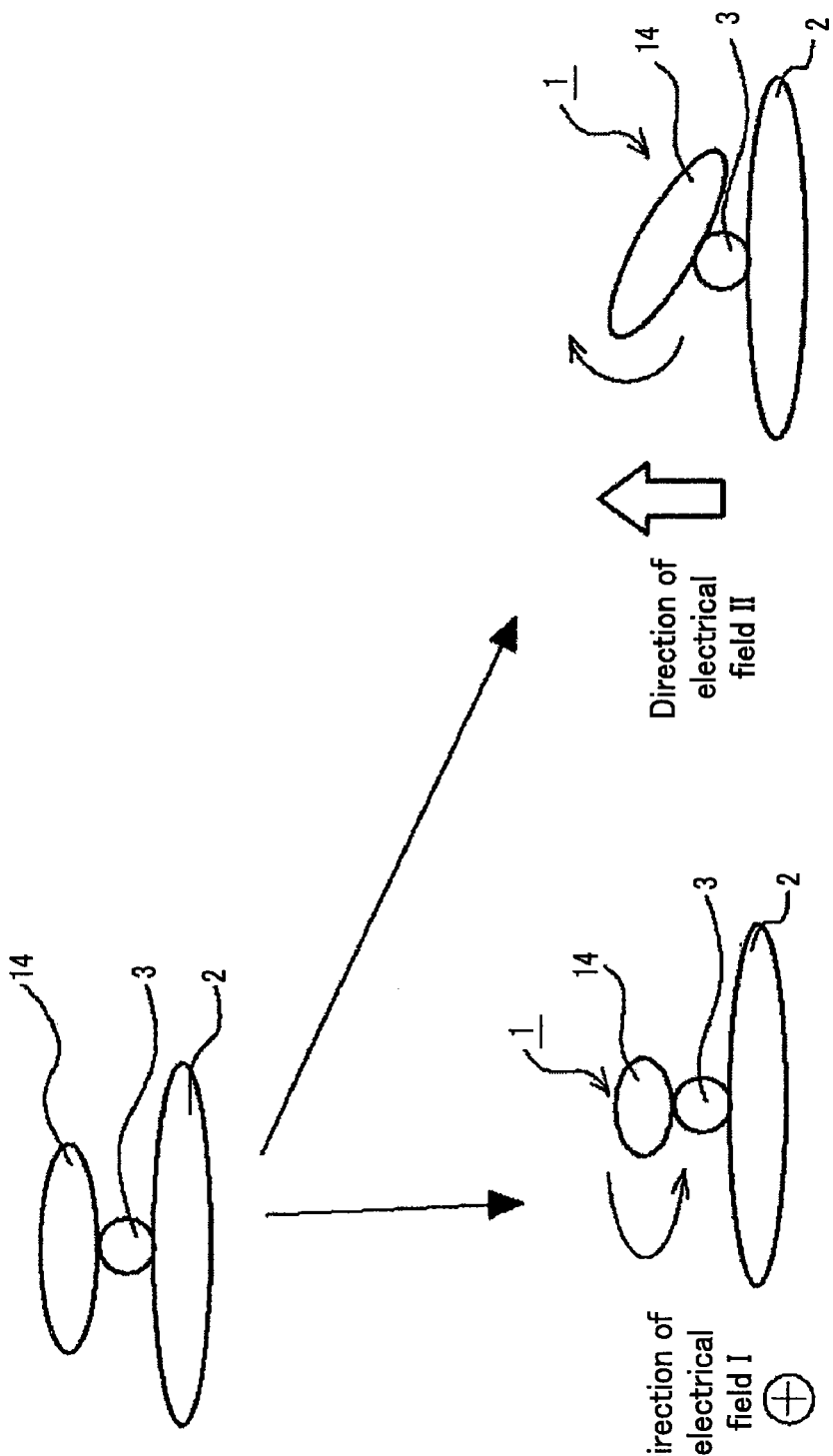

$V_{in} = 0$

I : OFF,   II : ON   $V_{out} = V_{in}$ $V_{in} = V_{DD}$

I : ON,   II : OFF   $V_{out} = 0$

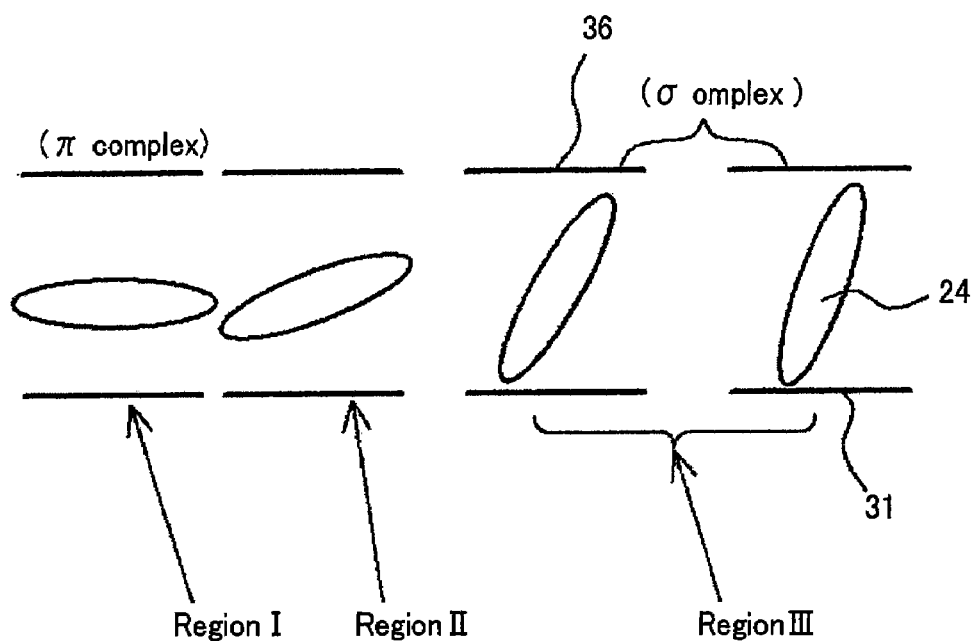
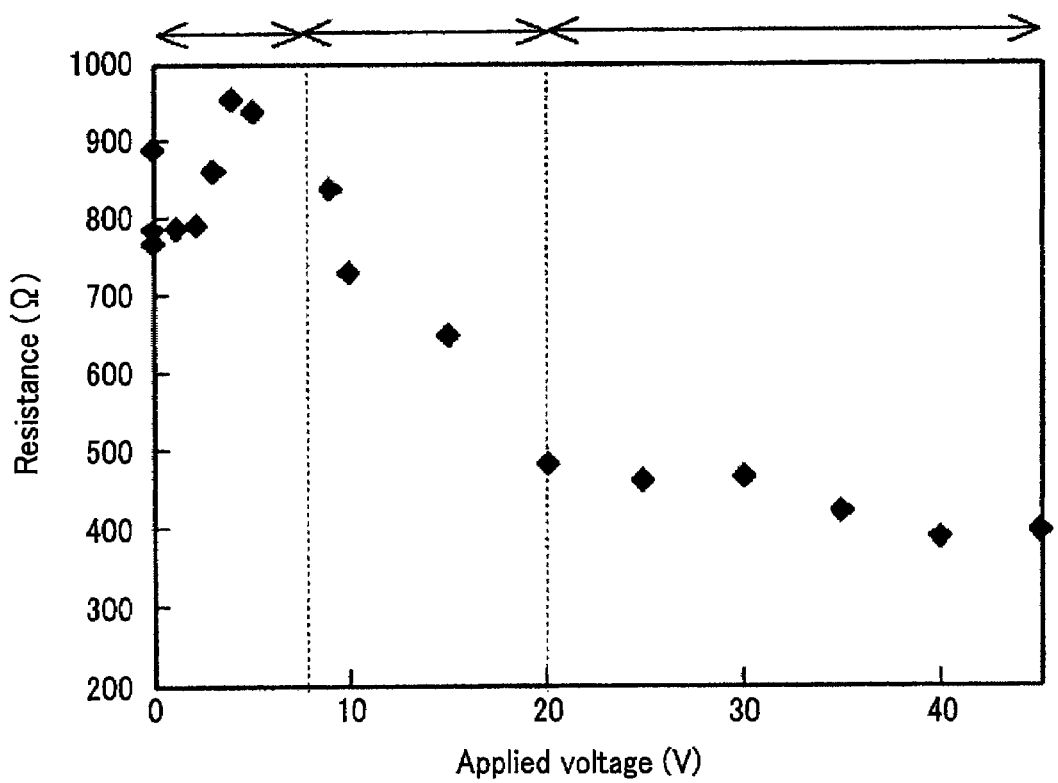
FIG. 7

FUNCTIONAL MOLECULAR DEVICE

CROSS REFERENCE TO RELATED APPLICATIONS

The present application claims priority to Japanese Patent Document No. P2004-184589 filed on Jun. 23, 2004, the disclosure of which is herein incorporated by reference.

BACKGROUND

The present application relates to a functional molecular device employing a functional molecular element demonstrating its functions under the operation of an electrical field.

In the field of a functional molecular element, realizing its functions under the action of an electrical field, researches are now being conducted for employing the nano-technology, which is a technology of observing, fabricating and utilizing a miniaturized structure with the size of the order of one hundred-millionth of a meter (10-8=10 nm).

Towards the end of eighties, a microscope of ultra-high precision, called a scanning tunneling microscope, was invented, whereby it became possible to observe individual atoms or molecules. With the use of the scanning tunneling microscope, not only the atoms or molecules may be observed, but also these may be handled individually. For example, a report has been made of an instance of arraying atoms in the form of a letter or character on the surface of a crystal. However, even though the atoms or molecules may be handled in this manner, it would not be practical to handle an enormous number of atoms or molecules one by one to assemble a new material or device.

If the atoms, molecules or groups thereof are handled to form a nanometer-scale structure, a new enabling ultra-precision machining technology is necessitated. This nanometer-scale ultra-fine machining technology may roughly be classified into the following two systems.

One of these is the so-called top-down system in which a silicon wafer of a larger size is machined to a small size to the limit of machining and an integrated circuit is formed thereon. This system has so far been used for the fabrication of a variety of semiconductor devices. The other is the so-called bottom-up system in which atoms or molecules, as the units of the miniscule size, are used as components, and a target nanometer-scale structure is fabricated by assembling these small components together.

As for the limit towards reducing the size of a structure in accordance with the top-down system, there is a famous Moore's law propounded in 1965 by Gordon E. Moore who is a joint founder of the Intel Corporation. This law states that the degree of transistor integration is doubled in eighteen months. Since 1965, the industrial circles of semiconductors succeeded in raising the degree of transistor integration for over thirty years, as predicted in the Moore's law.

The road map ITRS (International Technology Roadmap for Semiconductor), for the fifteen years to come, as publicized by the United States Semiconductor Industry Association (SIA), European Semiconductor Industry Association, Japan Electronics and Information Technology Industries Association, Korean Semiconductor Industry Association and Taiwan Semiconductor Industry Association, expresses an opinion that the Moore's law will continue to remain valid.

The ITRS is composed of a short-span road map, valid until 2013, and a long-span road map, valid until 2020. The short-span road map states that, in 2013, the process rule for the semiconductor chip and the gate length of a microprocessor will become 32 nm and 13 nm, respectively. The long-span road map states that the gate length in 2020, the process role for the semiconductor chip and the gate length of a microprocessor will become 14 and 6 nm.

The more the semiconductor chip is miniaturized, the higher becomes its operating speed and the lower becomes the power consumption. Moreover, the number of components that may be produced from a sole wafer becomes larger, with the production cost being correspondingly lowered. This accounts for competition among microprocessor manufacturers for miniaturizing the process rule and for raising the integration degree of transistors.

In November 1999, a laboratory group of United States has clarified the results of epoch-making researches in the miniaturization technology. These researches are for a method of designing a gate on an FET (field-effect transistor), termed FinFET, developed by a group of Professor Cheming Hu specializing in the computer science in Berkeley School of the University of California, USA. This method enables a number of transistors, about 400 times as many as that of the conventional technology, to be fabricated on a semiconductor chip.

The gate is an electrode controlling the flow of electrons in the channel in an FET. In the currently accepted routine designing, the gate is placed on the semiconductor surface in a parallel relation thereto for controlling the channel from one side. With this structure, an electron flow cannot be interrupted except if the gate is of a length exceeding a certain length. Hence, the gate length has so far been taken to be among the factors restricting the miniaturization of the transistors.

With the FinFET, on the other hand, the gate is of a forked configuration lying on both sides of the channel in order to effectively control the channel. It is possible with the FinFET to further reduce the size of the gate length and the transistor than with the conventional transistor structure.

The gate length of a prototype FET, prepared by the laboratory group, is 18 nm, which is one-tenth of the currently accepted ordinary gate length. This gate length of the laboratory group compares favorably with the size for the year 2014 specified in the long-span road map of ITRS. It is stated that a gate length equal to one-half the above gate length may be possible. Since Professor Hu et al. state that they are not willing to acquire patent for the technology in expectation of wide acceptance in the semiconductor circles, the FinFET is expected to be in the mainstream of the fabrication technique in future.

However, it has also been pointed out that the Moore's law will reach a limit by the law of nature sooner or later.

For example, in the semiconductor technology, now in the mainstream, a semiconductor chip is fabricated as a circuit pattern is printed on a silicon wafer by the lithographic technology. For raising the degree of miniaturization, the resolution has to be raised. For raising the resolution, it is necessary to put the technique of utilizing light of a shorter wavelength to practical use. Since physical limitations are imposed on the wavelength of light that can be exploited in the lithographic technology, there is necessitated a breakthrough from a different aspect in order to surmount the limitations imposed on the wavelength.

There is also fear that the quantity of heat evolved per semiconductor chip is excessively increased with increase in the degree of integration, thus possibly causing malfunctions or thermal destruction of the semiconductor chip.

In addition, according to experts' predictions, if the semiconductor circles continue their endeavor in reducing the ship size, investment or process costs are increased and, in conjunction with the lowered yield, the semiconductor industry will become inviable in ca. 2020.

As a new technology for making a breakthrough of the technological barrier inherent in the top-down system, the researches directed to endowing individual molecules with the functions of electronic components are stirring up notice. The target of these researches is an electronic device, such as molecular switch, formed by an individual molecule, and which is prepared in accordance with the bottom-up system.

Researches for fabricating a nanometer scale structure of metals, ceramics or semiconductors in accordance with the bottom-up system are also underway. However, if molecules, which are separate and independent from one another and which, in case the difference in shape or functions is taken into account, may be of millions of species, are ingenuously exploited, it may be possible to re-design and fabricate the devices (molecular devices), having features totally different from those of the conventional devices, in accordance with the bottom-up system.

For example, the width of an electrically conductive molecule is as small as 0.5 nm. With a linear array of these molecules, it is possible to achieve a wire having a density thousands of times higher than one of a line of a width of the order of 100 nm realized with the current integrated circuit technology. On the other hand, if a sole molecule is used as a storage element, the recording density as high as about ten thousand times that of the DVD (Digital Video Disc) may be achieved.

The molecular device is synthesized by a chemical process, in a manner different from the case of conventional semiconductor silicon. In 1986, a world's first organic transistor, formed of polythiophene, was developed by Yusi Koezuka of Mitsubishi Electric Co. Ltd., Japan.

On the other hand, an organic electronic device could be prepared with success by a laboratory group of the Hewlett-Packard (HP) of USA and the Los Angeles school of the University of California, and the report thereon was made in 'Science' in July 1999. The contents of the studies by the laboratory group are concretely disclosed in U.S. Pat. Nos. 6,256,767B1 and 6,128,214. The laboratory group fabricated switches, using molecular films of several millions of organic rotaxane molecules, and joined these molecular switches together to form an AND gate as a fundamental logic circuit. This molecular switch is of the size one millionth of that of the routine transistor and, because of its miniature size, may become a building block for constructing a small-sized high-performance computer.

On the other hand, a joint laboratory group of University of Rice and University of Yale of USA succeeded in fabricating a molecular switch in which a molecular structure is changed by electron implantation under application of an electrical field in order to perform a switching operation. The contents of the researches by the laboratory group are disclosed in J. Chen, M. A. Reed, A. M. Rawlett and J. M. Tour, "Large on-off ratios and negative differential resistance in a molecular electronic device", Science, 1999, Vol. 286, 1552-1551, and in J. Chen, M.A. Reed, C. Zhou, C. J. Muller, T. P. Burgin and J. M. Tour, "Conductance of a molecular junction", Science, 1997, Vol. 278, 252-254. The function of repeated on-off has not been accomplished by the group of the HP Inc. and the Los Angeles School of University of California. This molecular switch is also of the size one millionth of that of the routine transistor, and may become a building block for constructing a small-sized high-performance computer.

The professor J. Tour, University of Rice, who is specializing in chemistry, and who succeeded in the synthesis, states that the production cost of the molecular switch may be one several-thousandth of that of the conventional system because no expensive clean room, ordinarily used for semiconductor fabrication, is required, and that a hybrid computer of molecules and silicon will be fabricated within five to ten years to come.

In 1999, the Bell Laboratories (Lucent Technology Inc.) fabricated an organic thin-film transistor, using a pentacene single crystal. This transistor was of characteristics which favorably compare with those of an inorganic semiconductor.

Even though the researches in a molecular device, having the function of an electronic component, are going on briskly, the researches so far made were mostly directed to driving with light, heat, protons or ions (see "Molecular Switches", WILEY-VCH, Weinheim, 200, edited by Ben L. Fering a), and only a limited number of the researches were directed to driving with an electrical field.

Among known devices driven by an electrical field, there is a molecular film dielectric device exhibiting the electrical field response function on the basis of the principle which relies upon reversible changes in the conformation in a space of a molecule brought about on application of an electrical field, as stated in the Japanese Laid-Open Patent Publication 2003-218360. This device includes at least a self-assembled monolayer, containing a dielectric anisotropic molecule, provided on a substrate, and an electrical field controller for applying an electrical field on the self-assembled monolayer. The dielectric anisotropic molecule is a compound having a terphenyl skeleton as a movable part responsible for reversibly changing the three-dimensional conformation based on application of the electrical field by the electrical field controller.

Meanwhile, the molecular elements, driven by the electrical field, so far proposed in the art, were only those exploiting the changes in the physical properties of the molecules themselves, caused under the influence by the electrical field. That is, the molecules themselves are thought of as single elements and the states of the electrons are varied by the electrical field. For example, in an organic FET, carrier migration in an organic molecule is modulated by changes in an electrical field acting on an organic molecule in a channel region. However, no proposal has so far been made which effectively applies a molecular element to an integrated circuit.

SUMMARY

In view of the above-described status of the art, it is an object of the present application to provide a functional molecular device, optimally constructed with the use of a functional molecular element, the function of which is effectively controlled by an electrical field on the basis of a new principle.

The present application provides a functional molecular device including a plural number of gates, connected together, with each of the gates being formed by a channel part, an electrical field applying part and an output part. The channel part is formed of a compound having the $\pi$ electron conjugated system changed mainly by two sorts of changes in a molecular structure induced by an electrical field. The electrical field applying part applies the electrical field, and the output part takes out an output corresponding to the electrical field through the channel part. The gates display respective different electrical characteristics, such as different electrical characteristics, such as different values of the channel resistance or different values of electrical conductivity, by the electrical field.

In the functional molecular device, according to the present application, the channel part is constituted with a compound having a π electron conjugated system changed by changes in a molecular structure induced by an electrical field, so that, with the π electron conjugated system, electrical characteristics of the functional molecular device, such as electrical conductivity, may be derived. Additionally, these electrical characteristics may be modulated by changes in the molecular structure induced by changes in the electrical field.

Such operating mechanism of the electrical field may not be seen in, for example, a field effect transistor employing a conventional functional molecular element in which it is attempted to directly control the state of an electron of a functional molecule by an electrical field to modulate its function. If the new operating mechanism of the electrical field is exploited, such a functional molecular device may be constructed which may control electrical characteristics with high field response characteristics.

In particular, a plural number of the gates, each formed by the channel part, formed of the compound of the functional molecule, the electrical field applying part and the output part, may be connected together to effectively constitute an integrated circuit, above all, a logic gate circuit. Specifically, with such a gate, out of a plural number of the gates, which has not been processed with electrical field processing, the current flowing through the source-drain path is increased against an electrical field applied. Conversely, with such a gate which is formed of the same material as the first-stated gate and which is processed with electrical field processing, the current flowing through the source-drain path is decreased against the gate voltage applied. Thus, the two gates display respective different characteristics. Hence, if these gates are connected together, it is possible to construct, from the same material, a molecular transistor which may rival the so-called CMOS (Complementary MOS). That is, a plural number of the gates may constitute a logic gate circuit as an inverter in which the gates exhibit respective different channel resistances by the electrical field.

That is, with the present application, conventional CMOS transistors, formed of inorganic semiconductors, may be replaced by functional molecular devices performing switching operations under a novel principle. In the case of a random-access memory, for example, it is possible to improve the integration degree at least by several orders of magnitude as compared to that with the routine silicon-based semiconductor, while unit prices per bit may be lowered at least by several orders of magnitude.

Additional features and advantages of the present application are described in, and will be apparent from, the following Detailed Description and the figures.

BRIEF DESCRIPTION OF THE FIGURES

FIGS. 1A, 1B and 1C are schematic side views showing two operating modes of switching realized by the functional molecular element embodying the present application. FIG. 1A shows the initial state, FIG. 1B shows an operating mode when an electrical field I is applied, and FIG. 1C shows an operating mode when an electrical field II is applied.

FIG. 7 is a graph showing the relationship between the voltage applied and the electrical conductivity in a field effect molecular device according to the present application.

DETAILED DESCRIPTION

Figure 2A:
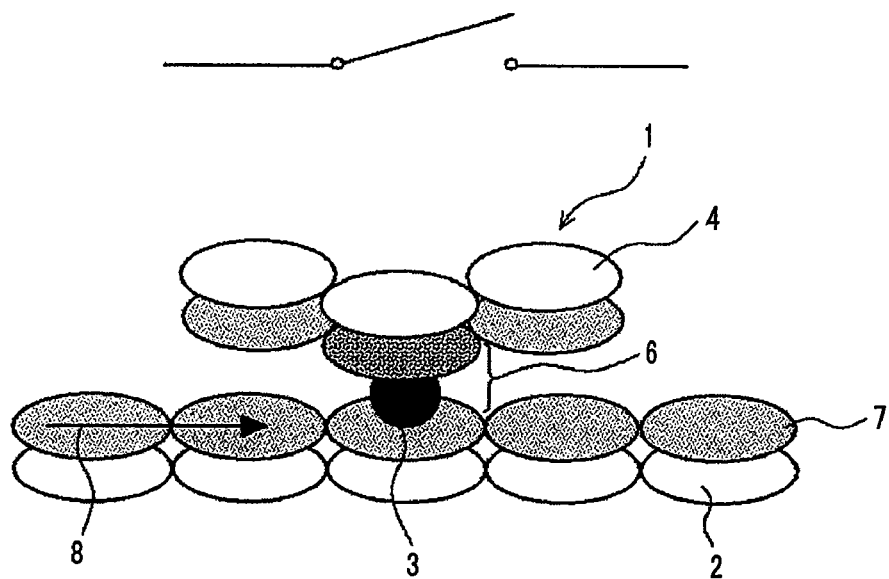
FIGS. 2A and 2B are schematic explanatory perspective views for illustrating, on the molecular level, the typical configuration of realization of the switching function of the functional molecular element, in the off-state and in the on-state of the element, respectively.

The present application is formed as a functional molecular device in which the channel part includes a molecule exhibiting dielectric constant anisotropy and/or dipole moment, a metal ion and a molecule of the conjugated system. The metal ion, the molecule exhibiting dielectric constant anisotropy and/or dipole moment, and the molecule of the conjugated system form a complex. The functional molecular device includes an electrical field applying part for applying an electrical field to the molecule exhibiting dielectric constant anisotropy and/or dipole moment, and an input/output part for inputting an electron to or outputting an electron from the molecule of the conjugated system.

In this case, the molecule exhibiting dielectric constant anisotropy and/or dipole moment is arrayed on electrodes adapted for applying said electrical field. The metal ions and the molecules of the conjugated system are arrayed between facing electrodes. An output corresponding to the electrical field is taken out from at least one of the facing electrodes. An electrically conductive path is formed by the molecules of the conjugated system. The electrically conductive path has electrical conductivity controlled by changes in the electrical field acting on the molecules exhibiting dielectric constant anisotropy and/or dipole moment.

In controlling the electrical conductivity, preferably a high frequency electrical field is applied to the complex, prior to application of the electrical field in a specified one of the plural number of the gates, in order to change the electrical conductivity of the electrically conductive path of the specified gate. That is, the plural number of gates preferably display respective different values of channel resistance or electrical conductivity.

Preferably, the position relationship of the molecule exhibiting dielectric constant anisotropy and/or dipole moment with respect to the direction of the electrical field is changed by changes in the electrical field acting on the molecule to cause changes in an angle the molecule makes with the molecule of the conjugated system, that is, in the angle of linkage via metal ion, a site of action of the metal ion or in a three-dimensional structure of the complex.

Preferably, a layer of the conjugated system and a layer of the molecule exhibiting dielectric constant anisotropy and/or dipole moment form a stack. Preferably, an insulating layer is provided on a first electrode, second and third electrodes are formed on the insulating layer in a manner free of contact with one another, and the stack is arranged at least between the second and third electrodes. Preferably, a fourth electrode is provided, either directly or via an insulating layer, on a layer of the molecule exhibiting dielectric constant anisotropy and/or dipole moment of the stack.

In a complex formed by a molecule exhibiting dielectric constant anisotropy and/or dipole moment, specifically, a Louis base molecule, changed in orientation under the action of an electrical field, a metal ion capable of becoming a Louis acid, and a molecule of the conjugated system, preferably the metal ion forms a complex with a Louis base molecule and a molecule of the conjugated system.

In such case, electrical characteristics of a functional molecular device, such as electrical conductivity, may be obtained by the molecule of the conjugated system. On the other hand, the Louis base molecule, exhibiting dielectric constant anisotropy and/or dipole moment, and changed in orientation under the action of the electrical field, is changed in orientation in keeping with the changes in the electrical field, whereby the complex forming part, for example, is changed in conformation to vary the electrical conductivity of the molecule of the conjugated system, that is, electrical characteristics of the functional molecular device.

In this functional molecular device, the two functions, that is, the function of demonstrating electrical characteristics and the function of modulating the characteristics by the electrical field, are taken charge of by the distinct molecules. Hence, the materials suited to respective objectives may be selected for the molecule of the conjugated system and the Louis base molecule, exhibiting dielectric constant anisotropy and/or dipole moment, and which are changed in orientation under the action of the electrical field. Hence, such a functional molecular device may be constructed which is capable of controlling the high performance electrical characteristics with high field response characteristics.

Preferably the molecule of the conjugated system is polypyrrole, the molecule exhibiting dielectric constant anisotropy and/or dipole moment is 4-pentyl-4'-cyanobiphenyl and the metal ion is silver ion, for example.

Referring to the drawings, preferred embodiments of the present application will be described in detail.

Functional Molecular Device

Typically of the functions of a functional molecular element 1, which are realized as its steric structure is changed on application of an electrical field, a switching operation may be contemplated. In FIGS. 1A, 1B and 1C, a functional molecular element 1, in which a Louis base molecule and an electrically conductive principal-axis molecule having a conjugated system 2 form a complex around a metal ion 3, is taken as an example. In FIGS. 1A, 1B and 1C, changes occurring around the metal ion 3 when an electrical field is applied to the functional molecular element 1 are shown modeled by schematic side views. For illustration sake, it is assumed in FIGS. 1A, 1B and 1C that the Louis base molecule is a molecule 14 having either a positive dielectric constant anisotropy or dipole moment along the long axis of the molecule.

This molecule 14 having either a positive dielectric constant or dipole moment along the long axis of the molecule attempts to orient itself in a direction in which the long axis direction thereof is coincident with the direction of the electrical field applied. Meanwhile, in case the Louis base molecule is a molecule exhibiting negative dielectric constant anisotropy, the molecule attempts to orient itself in a direction in which the long axis direction thereof is coincident with the direction of the electrical field. Hence, the explanation similar to the following explanation holds if the long axis direction and the short axis direction are interchanged.

As for the dynamics of the switching operation, shown by the molecule 14 at the time of application of an electrical field, two different sorts of the operating modes may be conceived, depending on the difference in the direction of application of the electrical field. FIG. 1A shows the initial state, FIG. 1B shows the operating mode when the electrical field I is applied and FIG. 1C shows the operating mode when the electrical field II is applied.

It is assumed that, in the initial state when the electrical field shown in FIG. 1A is not applied, the Louis base molecule 14 of the functional molecular element 1 is arrayed with its long axis direction parallel to the axial direction of the linear or film-shaped electrically conductive principal-axis molecule of the conjugated system 2, that is, parallel to the left-and-right direction of FIG. 1A.

If the electrical field I is applied in a direction perpendicular to the plane of the drawing sheet, the Louis base molecule 14 tends to perform a swinging movement through 90°, with the up-and-down direction in the drawing sheet as an axis, in an attempt to orient its long axis direction into coincidence with the direction of the electrical field I, as shown in FIG. 1B. The orientation of the Louis base molecule 14 may also be forcedly restored to the original left-and-right direction of FIG. 1B by applying the electrical field along the left-and-right direction of FIG. 1B.

If, on the other hand, an electrical field II is applied in the up-and-down direction, shown in FIG. 1C, the Louis base molecule 14 tends to perform a see-saw movement, with the direction perpendicular to the drawing sheet as an axis, in an attempt to orient its long axis direction into coincidence with the direction of the electrical field II, as shown in FIG. 1C. If the electrical field ceases to be applied, the pendant molecule reverts to its original state of orientation, shown in FIG. 1A, by natural relaxation.

Such change in the constitution or orientation of the Louis base molecule 14, brought about by the application of the electrical field, described above, produces a change in the constitution of the complex forming part with the metallic ion 3, as a result of which the state of bonding of the π complex forming part with the metal ion 3 or the molecular structure of the electrically conductive principal-axis molecule 2 is changed to change the electrical conductivity of the electrically conductive principal-axis molecule 2.

Figure 2B:
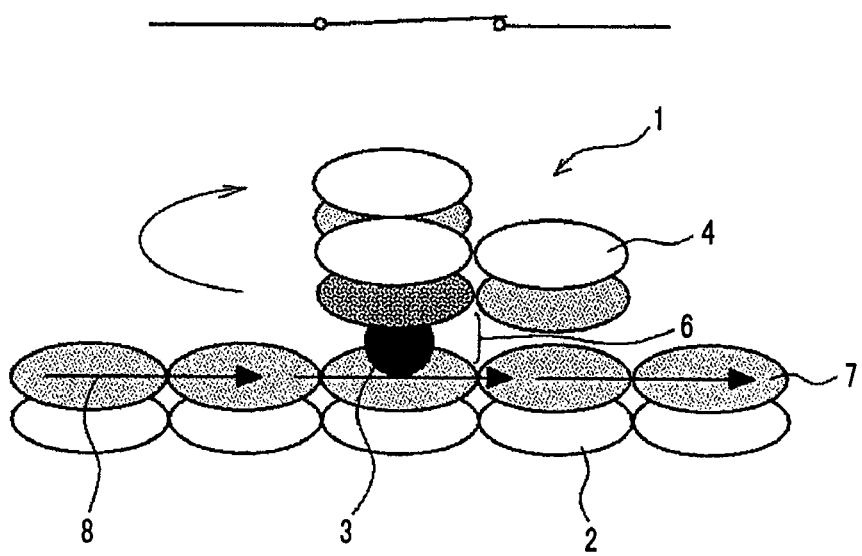

FIGS. 2A and 2B are schematic explanatory perspective views for illustrating, on the molecular level, an example of the configuration of demonstration of the switching function of the above-described functional molecular element 1. This functional molecular element 1 is made up by the linear or film-shaped principal-axis molecule 2 and the Louis base molecule 4 arranged in a pendant fashion on the principal-axis molecule 2 via metal ion 3 that may act as a Louis acid. This principal-axis molecule 2 is of the conjugated system and exhibits electrical conductivity by non-localized π electrons. The Louis base molecule 4 exhibits the dielectric constant anisotropy or the dipole moment, as described above. The electrically conductive principal-axis molecule having the conjugated system 2 and the Louis base molecule 4 constitute a complex 6 around the metal ion 3.

The Louis base molecule 4, forming a pendant part, exhibits dielectric constant anisotropy or dipole moment, and hence tends to be oriented, in an electrical field, in a specified direction with respect to the direction of the electrical field, that is, in a direction in which the long axis direction of the molecule is coincident with or perpendicular to the direction of the electrical field.

Thus, by varying the electrical field, acting on the Louis base molecule 4, the site of the pendant part may be varied with respect to the direction of the electrical field, as a result of which the angle between the Louis base molecule 4 and the principal-axis molecule 2 of the conjugated system, the site of the ligand, the metal ion is bonded to, or a structure of a complex forming part 6, e.g. a three-dimensional structure, may be varied to control the electrical conductivity of the principal-axis molecule 2 of the conjugated system, that is, the flow of electrons.

For example, FIG. 2A shows a case where the position relationship between the Louis base molecule 4 and the principal-axis molecule 2 of the conjugated system is not proper for conduction. In this state, the flow of electrons in the principal-axis molecule 2 is obstructed by the complex forming part 6, for the entire conjugated system, so that no electrons may flow, with the functional molecular element 1 then being in an off-state.

On the other hand, FIG. 2B shows a case where the orientation of the Louis base molecule 4 has been changed, so that the position relationship between the Louis base molecule 4 and the principal-axis molecule 2 of the conjugated system has become proper for conduction. In this state, the flow of electrons in the principal-axis molecule 2 is not obstructed by the complex forming part 6, for the entire conjugated system, so that electrons may flow, with the functional molecular element 1 then being in an on-state.

That is, with the functional molecular element 1, it is not that the electrical field directly acts on the electrically conductive principal-axis molecule 2 to modulate its electrical conductivity, but rather the electrical field acts on and causes movement of the Louis base molecule 4, such as to modulate the flow of electrons 6 in the complex forming part 6 through the so moved Louis base molecule. If the flow of electrons through the conjugated system 2 of the conjugated system is likened to the flow of water in the water main, the action of the electrical field in a conventional organic FET attempts to change the diameter of the water main. Conversely, with the instant embodiment, the action of the electrical field may be likened to acting on a handle (Louis base molecule 4) for opening/closing a valve (corresponding to the complex forming part 6) provided in the water main (corresponding to the electrically conductive principal-axis molecule 2).

Several combinations of the constitutions of the functional molecular element 1 may be thought of, depending on the difference in the constitutions of the complex forming part 6 or the pendant part.

For example, the pendant part may be formed of plural molecules exhibiting conjugated properties. In case the molecule 3, constituting the pendant part, is a molecule exhibiting the dielectric constant anisotropy, it may be positive dielectric constant anisotropy or may be negative dielectric constant anisotropy.

Field Effect Molecular Device

Here, a field effect molecular device 21, in which polypyrrole 22 is used as the principal-axis molecule 2 of the conjugated system, exhibiting electrical conductivity, a silver (I) ion 23 is used as a metal ion 3, and 4-pentyl-4'-cyanobiphenyl, abbreviated to 5CB below from time to time, 24 is used as a Louis base molecule 14, having dipole moment along the long axis direction of the molecule, and in which the three parts are assembled together to form a channel part, will be described. The method for fabrication of the device will also be described.

The molecular structures of 4-pentyl-4'-cyanobiphenyl 24 and pyrrole are as indicated below:

[Chemical Formula 1]

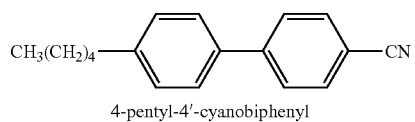

4-pentyl-4'-cyanobiphenyl

-continued

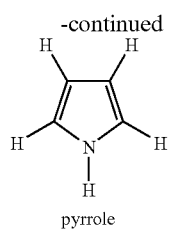

pyrrole

It is noted that polypyrrole 22 is a high molecular material in which pyrrole molecules are polymerized in a chain fashion.

Figure 3A:
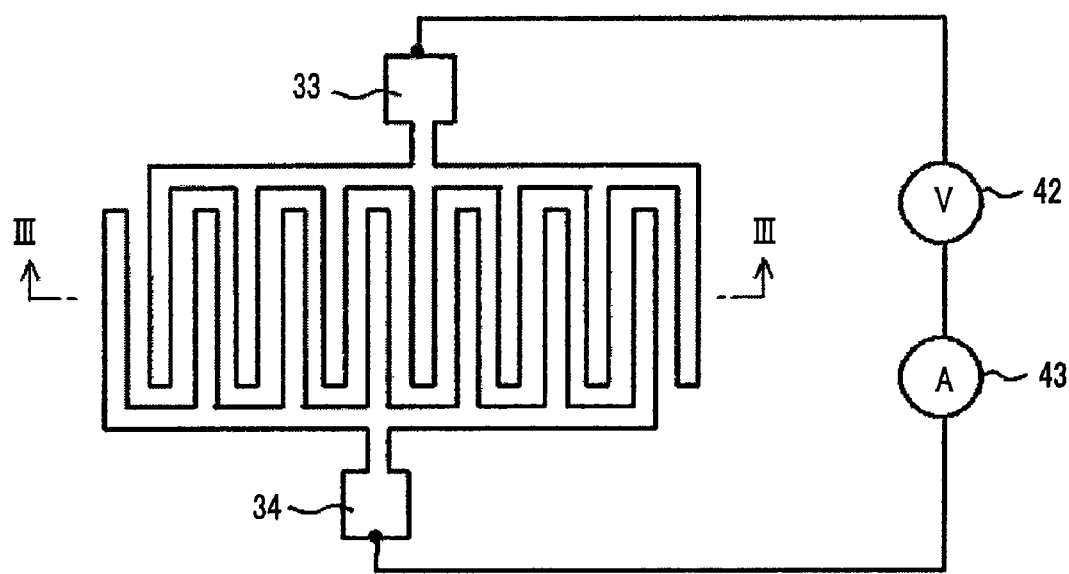
FIG. 3A is a plan view showing a field effect molecular device.
Figure 3B:
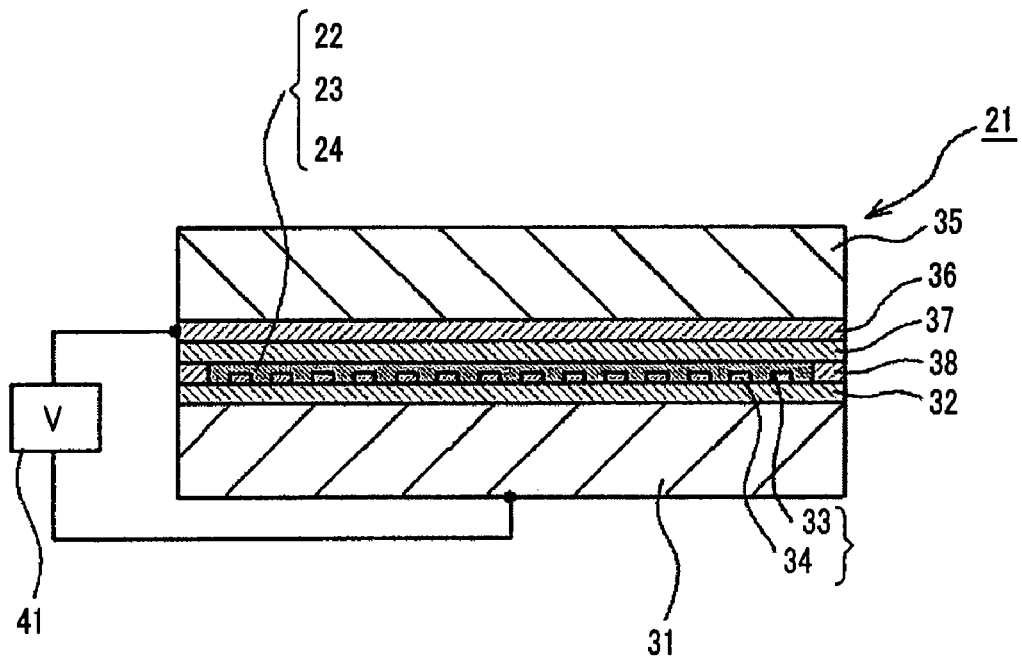
FIG. 3B is a cross-sectional view taken along line III-III of FIG. 3A.

FIG. 3A depicts a plan view showing the structure of comb-shaped electrodes 33 and 34, used in a field effect molecular device 21. FIG. 3B depicts a cross-sectional view taken along line III-III of FIG. 3A.

In this field effect molecular device 21, an insulating layer 32 is formed on a first substrate 31, used simultaneously as an electrode for applying a control electrical field. On the insulating layer, there are formed the comb-shaped electrodes 33, 34 used for measuring the electrical conductivity of polypyrrole 22. On a second substrate 35, there is formed an ITO (indium tin oxide) film 36, as another electrode for applying a control electrical field. A homogeneous orientation film 37 is layered thereon. Polypyrrole 22, silver (I) ion 23 and 4-pentyl-4'-cyanobiphenyl 24 are sandwiched, along with larger numbers of spacers, not shown, in between the two substrates 31, 35, and have their ends sealed by a sealant 38. In actuality, the layer of polypyrrole 22 and the layer of 4-pentyl-4'-cyanobiphenyl 24 may be stacked together.

The first substrate 31, also used as an electrode for applying a control electrical field, and the ITO film 36, as the other electrode for applying the control electrical field, are electrically connected to a power supply for applying a control electrical field 41. The comb-shaped electrodes 33, 34 are electrically connected to a power supply for measuring electrical conductivity 42 and to an ammeter 43.

Figure 4:
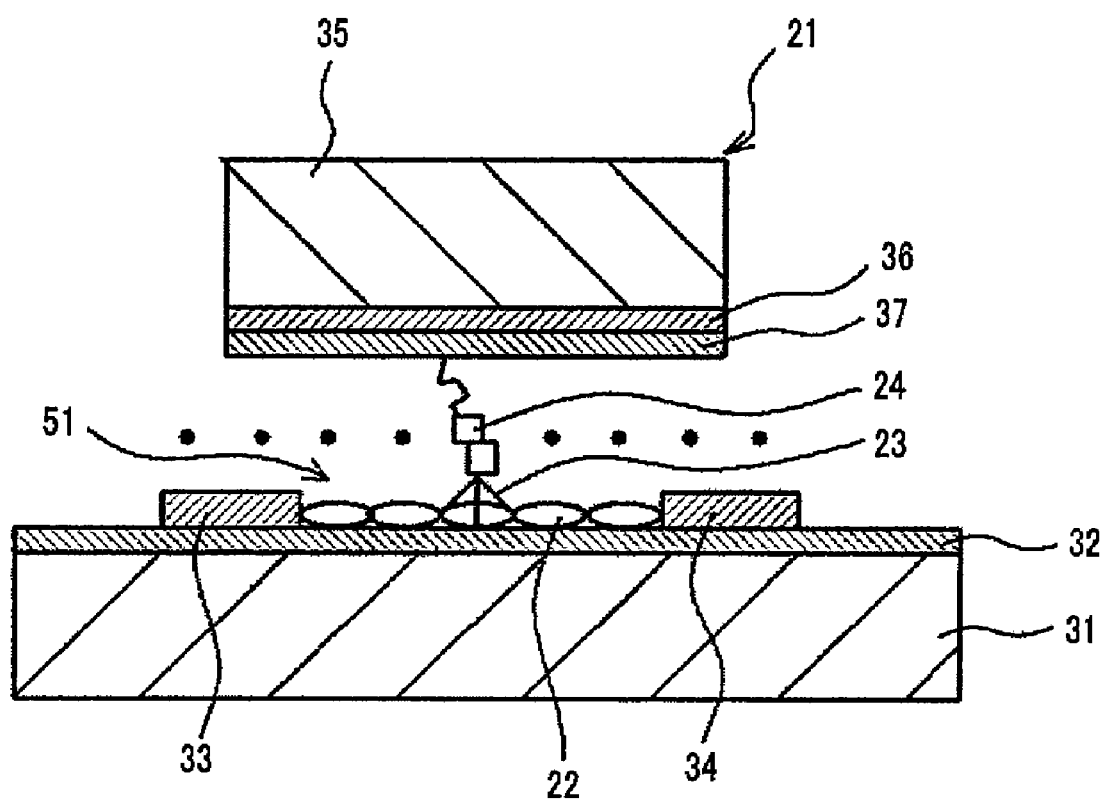
FIG. 4 is a schematic cross-sectional view showing the field effect molecular device.

FIG. 4 is a schematic cross-sectional view for illustrating the structure of the field effect molecular device 21. It is noted that, although only one unit each of polypyrrole 22, silver (I) ion 23 and 4-pentyl-4'-cyanobiphenyl 24, constituting a channel part 51, are shown in FIG. 4, these are shown only as representative and, in actuality, there are provided extremely large numbers of the units of the same chemical species. Referring to FIG. 4, the process for fabricating the field effect molecular device 21 will be explained in detail.

Initially, the electrodes 31, 36 for application of the control electrical field to 4-pentyl-4'-cyanobiphenyl 24, and the comb-shaped electrodes 33, 34, for measuring the electrical conductivity of polypyrrole 22, are fabricated.

As the first substrate 31, used simultaneously as electrode for applying the control electrode, a silicon substrate, doped to a high concentration, is used, as an example. A silicon oxide film is formed by thermal oxidation on the surface of the first substrate 31 for use as the insulating layer 32. The comb-shaped electrodes 33, 34 are formed on the insulating layer 32 by sputtering, for example.

As the second substrate 35, a glass substrate, for example, is used. On the surface of the glass substrate, an ITO film is formed, such as by vapor deposition in vacuum, for use as the other electrode for application of the control electrical field 36.

A homogeneous orientation film 37 of e.g. polyvinyl alcohol is formed, such as by coating, on the ITO film 36. The homogeneous orientation film 37 plays the role of aligning 4-pentyl-4'-cyanobiphenyl in an in-plane direction, while being used simultaneously as an insulating layer. The homogeneous orientation film 37 is processed with heating and subsequently processed with rubbing.

The materials of the functional molecular element are incorporated in a space between the above electrodes to form the main part of the field effect molecular device 21 which allows for modulation and measurement of the electrical conductivity.

After fabrication of the polypyrrole film 22 by an electrical field polymerization method, the polypyrrole film is detached from the electrode for electrical field polymerization, and stuck on the comb-shaped electrodes 33, 34 formed on the insulating layer 32 of the first substrate 31. The polypyrrole film is dried in situ to improve the tightness in bonding to the electrode. Thereafter, 4-pentyl-4'-cyanobiphenyl-silver (I) complex, synthesized beforehand, is coated on the polypyrrole film 22.

The first and second substrates 31, 35 are bonded together so that the homogeneous orientation film 37, formed on the second substrate 35, will be intimately bonded to this 4-pentyl-4'-cyanobiphenyl-silver (I) complex layer.

By this bonding, the 4-pentyl-4'-cyanobiphenyl molecule 24, contacted with the homogeneous orientation film 37, is oriented homogeneously along the rubbing direction. At this time, part of the amino group-NH, contained in the polypyrrole chain 22, forms a hydrogen bond with a cyano group —CN of 4-pentyl-4'-cyanobiphenyl, so that the polypyrrole chain 22 also is oriented in the rubbing direction. In distinction from a polypyrrole film in a random coil shape, the oriented polypyrrole chain 22 may exhibit high electrical conductivity. The result is that, when the application of the electrical field is turned on/off, as later explained, it is possible to modulate the electrical conductivity of the polypyrrole chain 22 appreciably. However, the π electron conjugated system of polypyrrole is not directly affected by the above-mentioned hydrogen bond.

Meanwhile, the cyano-CN of 4-pentyl-4'-cyanobipheny (5CB) 24 is mostly bonded together by the dipole-dipole interaction of the cyano groups to form dimers of the 5CB molecules 24. Part of the cyano group —CN is coordinated to the silver (I) ions or are hydrogen-bonded to the amino group —NH of the neighboring polypyrrole. Since the coordinate bond of the silver (I) ion and the cyano group is strong, there is no risk of breakage of the bond when the 5CB molecule 24 undergoes changes in coordination as a result of application of the electrical field. On the contrary, the hydrogen bond between the cyano and amino group is weak and hence may be broken when the coordination of the 5CB molecules 24 is changed.

Finally, the ends of the two substrates 31, 35, thus bonded together, are sealed with a sealant 38, such as epoxy resin, to complete the field effect molecular device 21.

The voltage applied to the electrodes for applying the control electrical field 31, 36 of the field effect molecular device 21 is turned on/off, and measurement is made of the electrical conductivity of the polypyrrole film 22 disposed between the comb-shaped electrodes 33 and 34. There may be observed a modulating action in which a high resistance value is shown during the electrical field off time but the resistance value is decreased on application of an electrical field.

During an initial state of orientation, prior to application of the electrical field, the homogeneous orientation dominates, with the orientation of the 5CB 24 being parallel to the orientation film. The 5CB molecule 24 has dipole moment, derived from the cyano base, and which operates along the direction of the long axis of the molecule. In the field effect molecular device 21, shown in FIGS. 3 and 4, the electrical field is applied in the up-and-down direction of the drawing sheet, and hence the operating mode of the pendant part is the see-saw type movement previously explained with reference to FIG. 1C. FIG. 4 shows the upstanding state of the 5CB molecule 24, brought about on application of a driving voltage.

The reason the modulation of the electrical conductivity occurs due to application of the electrical field is as follows: Before application of the electrical field, the silver (I) ion and the π electron of the pyrrole ring form a π complex. Since the position of the 5CB molecule with respect to the pyrrole ring is changed, due to a change in orientation of the 5CB molecule 24, brought about by the application of the electrical field, the 5CB-silver (I) complex forming part is moved to outside the pyrrole ring surface (π conjugated system). Hence, the silver (I) ion and the pyrrole ring form a σ complex, so that the distortion energy of the dihedral angle between the pyrrole ring is decreased, thus improving the electrical conductivity.

The 4-pentyl-4'-cyanobiphenyl (5CB) molecule used has properties as liquid crystal. However, since the switching operation itself is not in need of the liquid crystal properties, the molecular element may, of course, be used as a molecular level element. Also, it is noted that the sole 5CB molecule does not exhibit the properties of the liquid crystal.

In short, there is provided, in the present embodiment, a novel functional molecular element in which a molecule exhibiting dielectric constant anisotropy or dipole moment is disposed in the form of a pendant with respect to a linear of film-shaped electrically conductive principal-axis molecule, via a metal ion, and in which the pendant part is changed in its orientation relative to the direction of the electrical field to modulate the configuration of the complex molecule, such as to control the electrical conductivity of the electrically conductive principal-axis molecule (the flowing state of electrons).

The above-described functional molecular element causes the state of orientation of the molecule of the pendant part 4 to be changed, such as to control the flow of electrons in the electrically conductive principal-axis molecule 2, just as a tap of the water main is rotated to control the water flow in the water main. That is, a molecular element is realized from a wholly new perspective, in a manner different from the element of the related art in which a molecule itself is thought of as an element and the state of electrons in the molecule is changed to induce changes in electrical conductivity.

In general, an organic material, exhibiting electrical conductivity, has a π electron conjugated system. Since any material having a π electron is able to form a complex without fail, the above principle applies to all organic molecules exhibiting the electrical conductivity, that is, applies not only to polypyrrole, described above, but also to electrically conductive high molecular materials, such as polyparaphenylene, polynaphthalene, polyanthracene, polypyrene, polyazulene, polyfuran, polythiophene, polyselenophene, poly(paraphenylene sulfide), poly(paraphenylene oxide) or polyaniline. In addition, an oligomer of the above high molecular materials, having the polymerization degree not higher than 20, or a monomer, may also be used. Carbon molecules, having a π electron conjugated system, such as carbon nano-tubes, may similarly be used.

The Louis base molecules, which are responsive to the electrical field, may be enumerated by pyrimidine-based liquid crystal molecules, pyridine-based liquid crystal molecules, and cyano-based liquid crystal molecules, all containing nitrogen molecules, and liquid crystal molecules containing phosphorus atoms, in addition to the aforementioned 4-pentyl-4'-cyanobiphenyl molecule.

The metal ions, forming a complex, may be enumerated by ions of transition metals, such as vanadium, chromium, manganese, iron, cobalt, copper, zinc, ruthenium, rubidium, cadmium or mercury, in addition to the above-mentioned silver (I) ion.

The molecular element may be applied to a variety of electronic devices, such as switches, transistors, memories or logic circuits.

In addition to the aforementioned advantages that elements of variable sizes, ranging from the elements of the usual size to the nanometer-order elements, may be fabricated from the molecules of the same material, and that the molecule suited to objectives in view may be selected from among the molecules of a large variety of materials, the following may be pointed out as advantages of the above-described functional molecular element, formed of e.g. an organic molecule, according to the present application.

1. Low power consumption;
2. no limitation to the driving frequency used;
3. low pollution; and
4. multiple functions that may be achieved.

As for 1 above, since the unit of the operation is one molecule or one electron, the operation is basically possible with low power consumption and low heat evolution, so that there is scarcely raised the problem related with heating even if the integration degree is increased.

As for 2 above, high-speed response characteristics, exceeding those of the conventional inorganic semiconductor crystal, may be expected by ingenuous selection or designing of the materials or the structure, as may be testified from recent improvement in high-speed response characteristics of liquid crystals.

As for 3 above, since the organic molecule for use as the functional molecular element may be synthesized by routine methods for synthesis of organic compounds, there is no necessity for using reagents that may be harmful to humans or to environments, such as those used in a fabrication process for inorganic semiconductors.

As for 4 above, it is possible to realize the functions, not achievable in the conventional technology, such as a taste sensor or an odor sensor, on the premises that characteristics of a large variety of organic molecules are exploited.

Logic Gate Circuit Employing a Functional Molecular Element

The functional molecular element, the three-dimensional configuration of which is changed on application of an electrical field to demonstrate its function, as described above, exhibits reciprocally opposite I-V (current-to-voltage) characteristics, depending on the whether or not the electrical field processing is carried out, as will be explained later. Hence, the functional molecular element is able to constitute an inverter (NOT gate) formed by a CMOS transistor.

As long as no electrical field is applied, the polypyrrole-silver ion-5CB pendant molecule forms a π complex, as described above. This π complex is low in electrical conductivity because the dihedral angle between neighboring rings of polypyrrole is larger, that is, there is a state of twist, so that a π electron can hardly be conjugated. If now a gate voltage is applied to this π complex, the position relationship between the 5CB pendant molecule and pyrrole is changed, so that the π complex is turned into a σ complex. With this σ complex, the dihedral angle between neighboring rings of polypyrrole is small and hence the π electron is ready to be conjugated. Hence, the σ complex has high electrical conductivity.

Figure 5A:
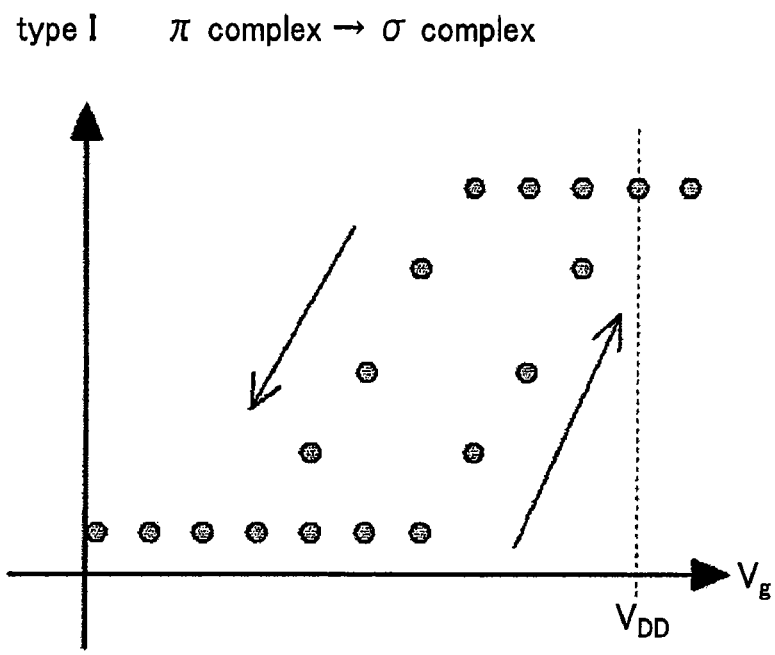
FIGS. 5A and 5B are graphs schematically showing changes by voltage application of the electrical conductivity of the type I and type II field effect molecular devices, respectively.

That is, if the gate voltage VG is off, the current I (the current between the source and the drain) is not liable to flow, whereas, if the gate voltage is on, the quantity of the flowing current may be increased, as shown in FIG. 5A. These I-V characteristics are termed the type I characteristics.

If a π complex, in which the principal-axis molecule of the conjugated system is polypyrrole, the Louis base molecule is a 5CB liquid crystal molecule and a metal ion is a silver ion, is processed with electrical field processing by a high frequency electrical field for one hour, all of the complexes exclusively become a complexes. If the gate voltage is applied to the σ complexes, the pyrrole rings, forming coordinate bonds with the 5CB pendant molecules, are rotated in unison, whereby the dihedral angle with respect to the pyrrole rings, not forming the coordinate bonds, is changed. That is, the π conjugated system of the electrically conductive high molecular material is localized to lower the electrical conductivity of the pyrrole ring.

Figure 5B:
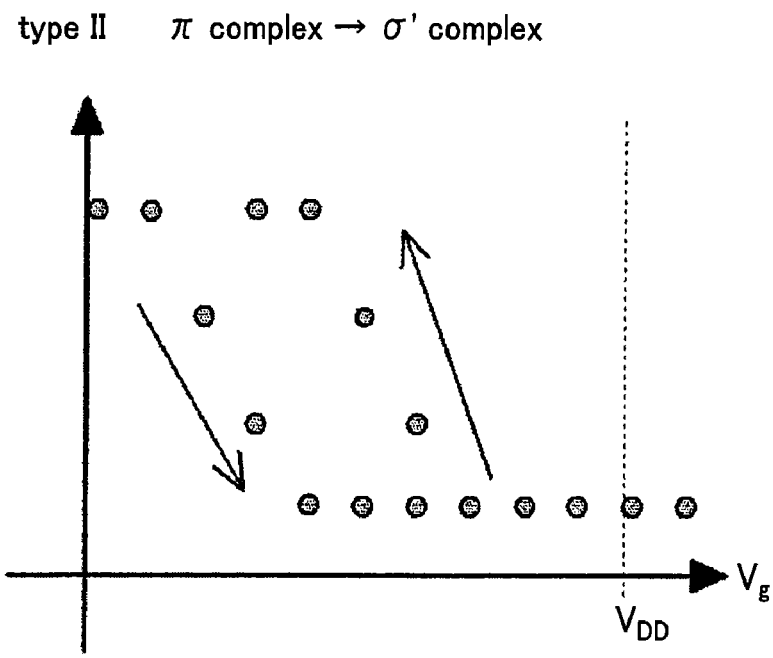

That is, when the gate voltage is off, the current is liable to flow and, when the gate voltage is on, the quantity of the current flowing may be decreased, as shown in FIG. 5B. The gate exhibiting these I-V characteristics is termed the type II.

Figure 6:
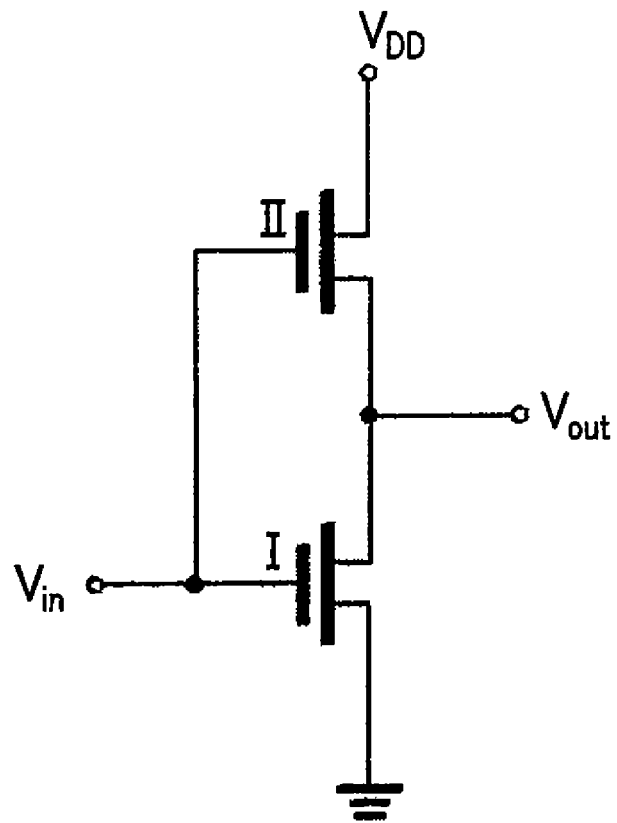
FIG. 6 is an equivalent circuit diagram of a CMOS inverter obtained on interconnecting the gates of the type I field effect molecular device and the type II field effect molecular device.

These gates may be connected in series between the power supply VDD and the ground level to form a logic gate circuit of the CMOS configuration (NOT gate), as shown in FIG. 6.

That is, the type I and the type II are mounted on one and the same substrate, and a common input voltage Vin is applied to the gates. The switching operation performed by the type I and that performed by the type II, for the same input voltage, are reversed from each other, so that, when the type II transistor is ON, the type I transistor is OFF. Hence, the output voltage VOUT=VDD. If conversely the type II transistor is OFF, the type I transistor is ON, so that the output voltage=VOUT=0.

In this manner, this CMOS configuration operates as a NOT circuit. Among the various logic gates, used in an integrated circuit, the NOT circuit may be said to be the most basic.

When the type I is ON, the type II is necessarily OFF, so that no current flows from the VDD and hence there is no power consumption. This represents a crucial property of the CMOS configuration and is correlated with its low power consumption. Since several millions of small-sized transistors are built in a large-scale integrated circuit, not only is power consumption increased, but also much heat is evolved in the circuit to give rise to malfunctions of the digital circuit. For this reason, the CMOS configuration is suited to the designing and construction of an integrated circuit. The CMOS configuration has high energy efficiency and lends itself to miniaturization, such that it is indispensable for the present-day integrated circuit.

Several Examples of the present application will now be described in detail.

<Field Effect Molecular Device>

A field effect molecular device 21, shown in FIGS. 3 and 4, was fabricated. Initially, the electrodes 31, 36 for applying a control electrical field to 4-pentyl-4'-cyanobiphenyl 24, and the electrodes 33, 34 for measuring the electrical conductivity of polypyrrole 22, were formed.

As the first substrate (electrode for applying the control electrical field) 31, a silicon substrate, doped to a high concentration, was used. The surface of the first substrate 31 was processed with heating to form a thin film of silicon oxide which was to be used as an insulating film 32. The comb-shaped electrodes 33, 34 of gold were formed by sputtering on the insulating film 32 for use as electrodes for measuring the electrical conductivity of polypyrrole 22.

The ITO electrode 36, as another electrode for applying a control electrical field, was formed by vacuum deposition on the second substrate (glass substrate) 35. The homogeneous orientation film 37, to be used simultaneously as an insulating film, was formed on the ITO electrode 36. Polyvinyl alcohol was used as an orientation film material. A 10 wt % aqueous solution of polyvinyl alcohol was prepared and applied by spin coating on the ITO electrode 36. The resulting system of polyvinyl alcohol was heated at 110° C. for 30 minutes.

The system of polyvinyl alcohol, obtained on heating, was subjected to rubbing processing. A large number of spacers, each 3 μm in diameter, were sprinkled on the heated system of polyvinyl alcohol and dried in vacuum for three days and nights.

An ITO electrode was formed on a glass substrate, on which to form the polypyrrole film 22, and a reduced polypyrrole film 22 was formed by an electrical field polymerization method. Specifically, the reduced polypyrrole film was prepared in accordance with a constant current method. As for operating conditions, polymerization was carried out at 1.0 mA/cm2 and 50 mC/cm2, followed by reduction at −0.5 mA/cm2 and 16 mC/cm2. The resulting film was peeled off and bonded on the comb-shaped electrodes 33, 34 on the first substrate. The first and second spacers were bonded together with the spacers in-between so that the gap between the two substrates will be 40 μm.

An aqueous solution of silver sulfate and 4-pentyl-4'-cyanobiphenyl were mixed together and reacted at 140° C. for three hours. The resulting 4-pentyl-4'-cyanobiphenyl-silver (I) complex solution was injected into a space between the first substrate 31 and the second substrate 35 by taking advantage of the capillary phenomenon. It is noted that, when a complex of polypyrrole, silver (I) ion and 4-pentyl-4'-cyanobiphenyl is formed, the film is changed appreciably in color, for example, from yellow to purple. This color change was noticed, so that formation of the complex could be demonstrated.

Finally, the ends of the two substrates 31, 35, bonded together, were sealed with a sealant 38 of, for example, epoxy resin, to complete the field effect molecular device 21.

The voltage applied across the electrodes for application of the control electrical field 31, 36 of the field effect molecular device 21, formed as described above, was turned on/off, and measurements were made of the electrical conductivity of the polypyrrole film 22 across the comb-shaped electrodes 33, 34 under the D.C. bias voltage. There was observed an operation of modulation in which the resistance value is high during the power supply off time and is decreased on electrical field application.

Measurements were made of the resistance across the comb-shaped electrodes 33, 34, in case a high frequency electrical field of 10 kHz, in the form of a bipolar rectangular waveform, was applied across the electrodes for application of the control electrical field 31, 36 of the field effect molecular device 21. The results of the measurement are shown in the graph of FIG. 7, in which the measured values of the resistance are plotted against the magnitude of the applied voltage. The entire region of the graph may roughly be divided into three separate sub-regions. In a top part of FIG. 7, there are schematically shown the states of orientation of the pendant part formed by 5CB 24 between the electrodes 31 and 36 for each of the sub-regions.

In the sub-region I where the applied voltage is less than 7 to 8V, the resistance value is scarcely changed, or increased only slightly, against an increase in the applied voltage. Although the reason the resistance value is increased is not clear, it may be estimated that the operation of the electrical field is insufficient in this sub-region I because of the excessively small value of the applied voltage, and hence the orientation of the pendant part is scarcely changed from the original state, as shown in the top part of FIG. 7. Hence, the change in the resistance value is also small.

In the sub-region II, with the applied voltage ranging between 9 and 20V, the resistance value is decreased appreciably with increase in the applied voltage. It may be estimated that, in the sub-region II, the applied voltage is sufficiently high and the state of orientation of the pendant part is determined as a function of the magnitude of the applied voltage, with the result that the resistance value is significantly affected by the applied voltage.

In the sub-region III, where the applied voltage exceeds 20V, the resistance value is varied only slightly with increase in the applied voltage. It may be estimated that, in the sub-region III, the changes in orientation of the pendant part become saturated, and hence the changes in orientation of the pendant part become small as shown in the top part of FIG. 7, with the result that changes in the resistance value are also small.

Figure 8:
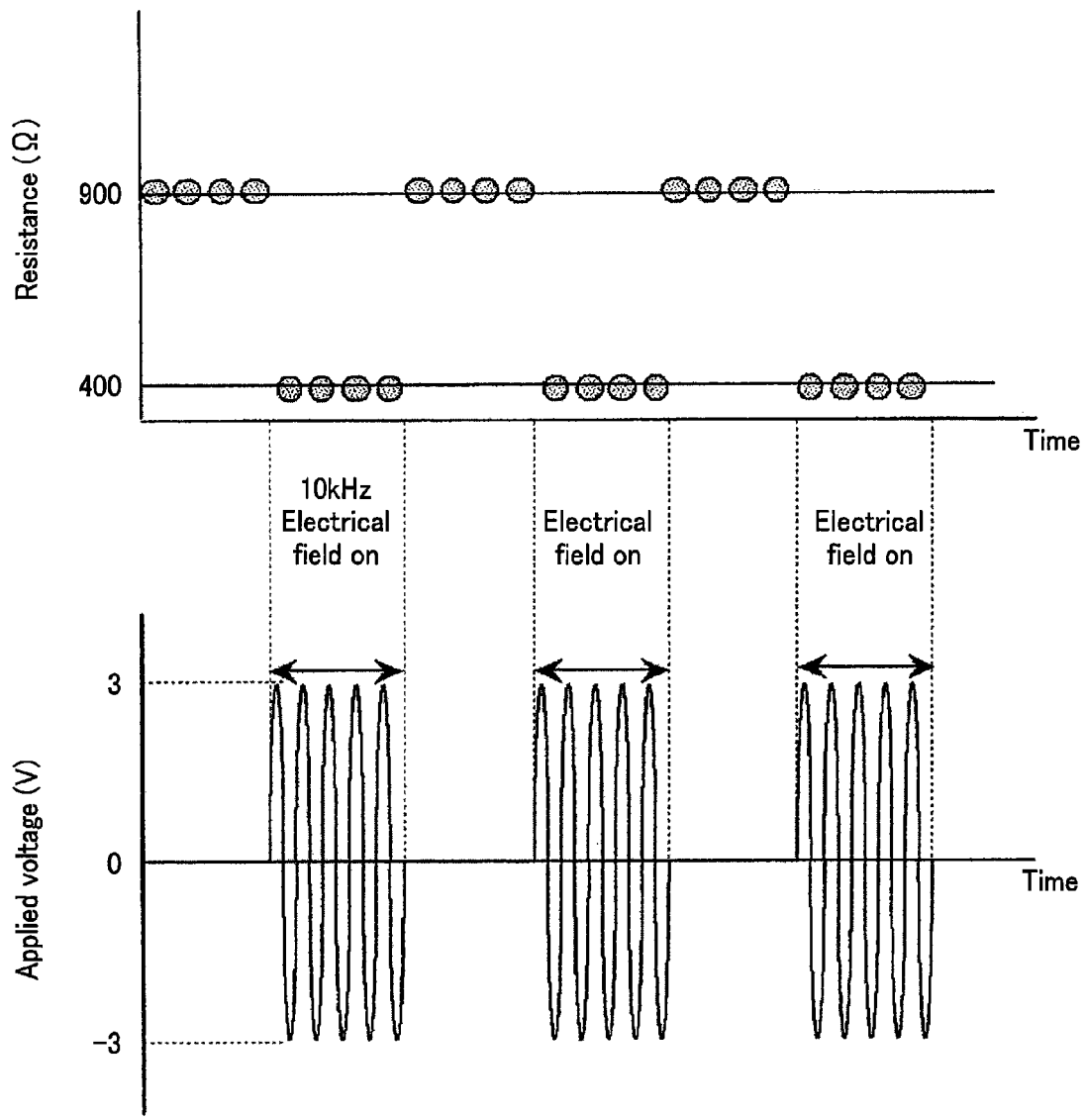
FIG. 8 is a graph showing that the electrical conductivity of the field effect molecular device can be modulated by application of an electrical field.

In the graph of FIG. 8, the measured values of the resistance between the comb-shaped electrodes 33, 34 in case a high frequency electrical field of 10 kHz and 1V/μm, in the form of a bipolar sine wave, is intermittently applied across the electrodes for application of the control electrical field 31, 36 of the field effect molecular device 21, are plotted against time. It is seen from the graph that the electrical conductivity is effectively modulated by the on/off of the electrical field.

For comparison, a pseudo field effect molecular device, not containing silver (I) ion, was fabricated in the same way as above, except substituting 4-pentyl-4'-cyanobiphenyl, by itself, to be injected into a space between the two substrates, for 4-pentyl-4'-cyanobiphenyl-silver (I) complex, and measurements were made of the electrical conductivity of the resulting structure. At this time, the color of the reduced polypyrrole film remained yellow, while there were noticed no change in electrical conductivity as a result of the application of the electrical field. The reason may be such that, since there is no silver (I) ion 23, and hence there is formed no linkage between the 4-pentyl-4'-cyanobiphenyl 24 and polypyrrole 22, the operation of the electrical field on 4-pentyl-4'-cyanobiphenyl 24 was not strong enough to produce changes in electrical conductivity of the polypyrrole 22.

A measurement cell for visible ultraviolet light absorption spectrum, formed of the same materials as those of the field effect molecular device 21, was fabricated in order to clarify the operating mechanism of the effect of application of the electrical field based on the absorption spectrum of the visible ultraviolet light. The cell was fabricated in the same way as in Example 1, except using calcium fluoride substrates for the first substrate 31 and the second substrate 35, and except providing transparent electrodes, formed by transparent electrically conductive films, as the electrodes for application of the control electrical field, on those substrates. There were provided no comb-shaped electrodes, such as comb-shaped electrodes 33, 34.

A 4-pentyl-4'-cyanobiphenyl-silver (I) complex solution was injected into a space between the first substrate 31 and the second substrate 36, by taking advantage of the capillary phenomenon. By so doing, a complex of polypyrrole, silver (I) ion and 4-pentyl-4'-cyanobiphenyl was formed. The film was appreciably changed in color from yellow to purple, which testified to the fact that the complex has been formed.

Figure 9:
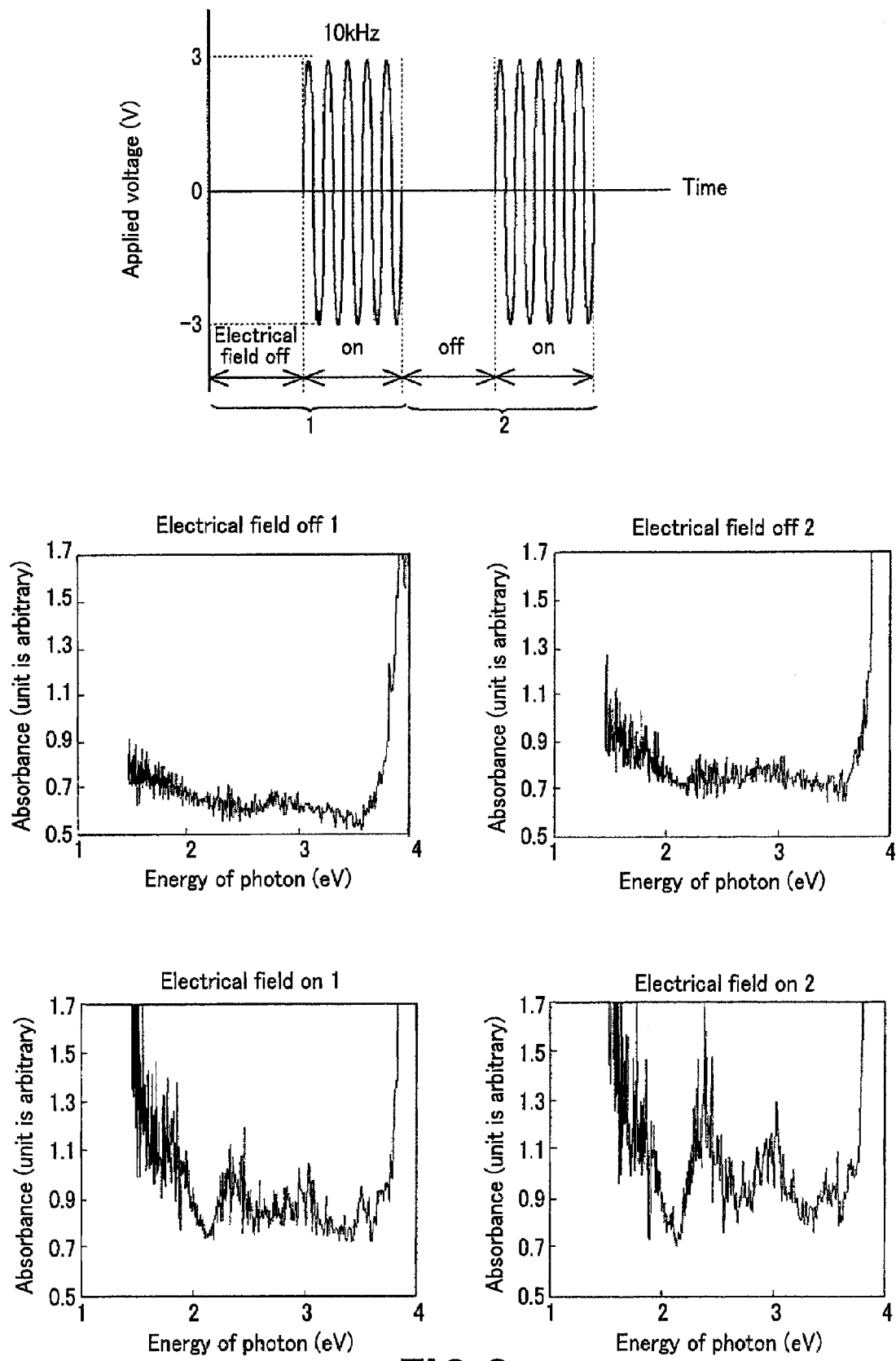
FIG. 9 shows the visible ultraviolet light absorption spectrum by an absorption spectrum measurement cell formed of the same materials as those of the field effect molecular device.

A high frequency electrical field of 10 kHz and 1V/μm, in the form of a bipolar sine wave, was intermittently applied across the electrodes for application of the control electrical field of the measurement cell for measuring the visible ultraviolet light absorption spectrum, and measurements were made of the absorption spectrum of the visible ultraviolet light at such time. The results of the measurements indicated that the locally maximum values of absorption are shifted by on/off of the electrical field, as shown in FIG. 9.

For comparison, a pseudo cell for measurement of the absorption spectrum was fabricated in the same way as described above, except that only 4-pentyl-4'-cyanobiphenyl was injected, in place of 4-pentyl-4'-cyanobiphenyl-silver (I) complex, into a space between the substrates, so that no silver (I) ion will be contained in the so fabricated cell. As a high frequency electrical field of 10 kHz, in the form of a bipolar sine wave, was intermittently applied across the electrodes for application of the control electrical field of the pseudo cell, in the same way as described above, measurement was made of the absorption spectrum of the visible ultraviolet light of the pseudo cell. The results of the measurement are as shown in FIG. 10.

Figure 10:
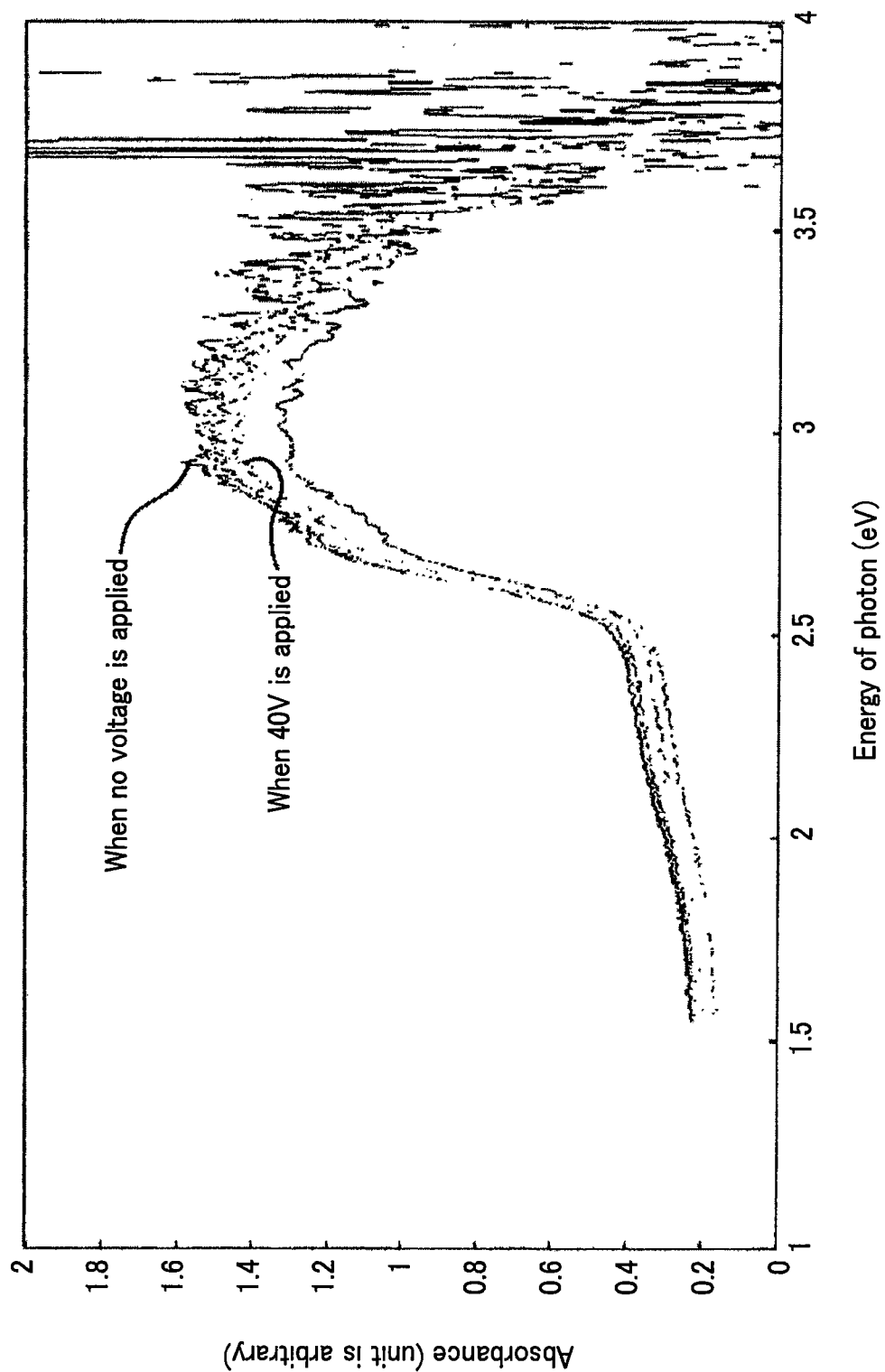
FIG. 10 shows the visible ultraviolet light absorption spectrum by a pseudo absorption spectrum measurement cell by a Comparative Example of the present application.

Referring to FIG. 10, showing spectra, in overlaid state, as measured under a variety of applied voltages of from 0V to 40V, there could not be observed a phenomenon in which the wavelengths, indicating the locally maximum values of the absorption spectrum, are shifted due to on/off of the electrical field. The reason may be such that, since there is present no silver (I) ion 23, and there is formed no linkage between 4-pentyl-4'-cyanobiphenyl 24 and polypyrrole 22, the operation of the electrical field on 4-pentyl-4'-cyanobiphenyl 24 does not translate itself into changes in electrical conductivity of polypyrrole 22.

<I-V Characteristics of Type I Field Effect Molecular Device>

The electrical field Vg, applied across the electrodes for application of the control electrical field 31, 36 of the field effect molecular device 21, fabricated in the same way as described above, was increased gradually from zero, and measurements were made of the current density Ids of the current flowing through the polypyrrole film 22 disposed between the comb-shaped electrodes 33, 34, under an A.C. bias voltage. There was noticed the action of modulation in which the current density Ids, which is small when the electrical field Vg is off, is progressively increased with increase in the electrical field Vg applied. Also, when the electrical field Vg applied is progressively decreased, the current density Ids is decreased, however, there was noticed the hysteresis phenomenon, That is, the measured value of the current density Ids when the electrical field Vg applied was decreased from a value of the electrical field Vg was greater than the measured value of the current density Ids when the applied electrical field Vg was increased from the same value of the applied electrical field Vg.

Figure 11:
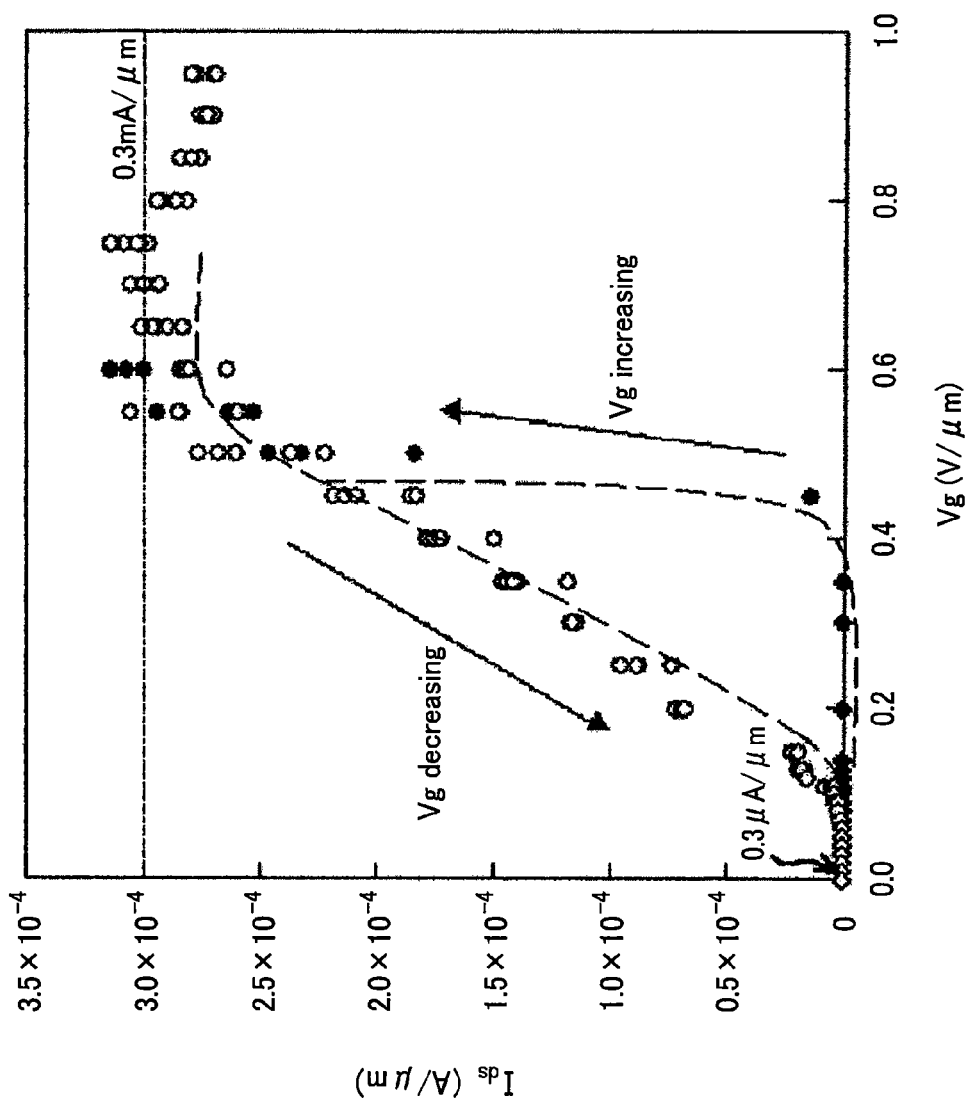
FIG. 11 is a graph showing the relationship between the intensity of the electrical field applied and the density of the current flowing across comb-shaped electrodes in the type I field effect molecular device embodying the present application.

FIG. 11 depicts a graph showing the relationship between the strength of the electrical field Vg and the current density Ids in case a 10 kHz high-frequency electrical field in the form of a bipolar rectangular wave was applied across the electrodes for application of the control electrical field 31, 36 of the field effect molecular device 21. Referring to FIG. 11, in case the applied electrical field Vg is increased, Ids begins to assume a significant magnitude only when Vg barely exceeds 0.4 V/μm, whereas, when the applied electrical field Vg is decreased after Ids has reached a maximum value (approximately 0.3 mA/μm), Ids is kept at a value of the order of 60% of the maximum value even in case Vg is decreased to 0.4 (V/μm), with Ids reverting to a value close to zero only when Vg is decreased to a value of the order of 0.1 (V/μm). This testifies to the hysteresis phenomenon. The above I/V characteristics are proper to the above-mentioned type I gate.

A measurement cell for measuring the infrared absorption spectrum was fabricated from the same materials as those of the field effect molecular device 21, in order to clarify the above-described operating mechanism of the effect of application of the electrical field based on measurement of the infrared absorption spectrum. The measurement cell was fabricated in the same way as in the Example 1, except using calcium fluoride substrates as the first substrate 31 and the second substrate 35, and except providing, on those substrates, the transparent electrodes, formed by transparent electrically conductive films, as the electrodes for application of the control electrical field. There were provided no comb-shaped electrodes, such as comb-shaped electrodes 33, 34.

Figure 12:
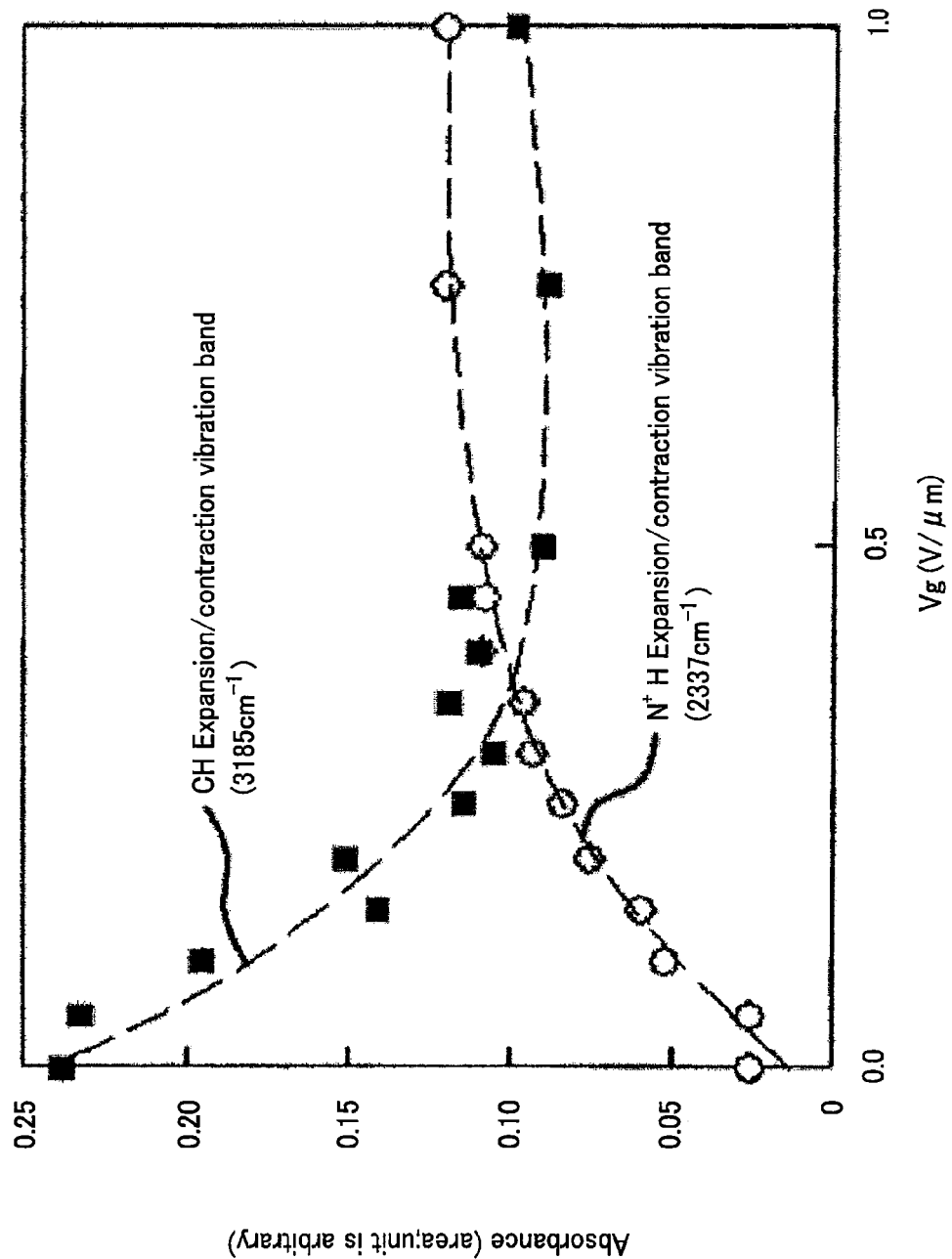
FIG. 12 is a graph showing the relationship between the intensity of the electrical field applied and the strength of the infrared light absorption in an absorption spectrum measurement cell formed of the same materials as those of the field effect molecular device.

As in the previous Example, a 10 kHz high-frequency electrical field in the form of a bipolar rectangular wave was applied across the electrodes for application of the control electrical field of the measurement cell for measuring the infrared absorption spectrum. The electrical field was progressively increased from zero, and inspection was made of the infrared absorption spectrum during such time. It was seen that changes were produced in the N+H expansion/contraction vibration band (2337 cm-1), as a proof of polypyrrole and silver (I) ion forming a σ complex, and in the CH expansion/contraction vibration band (3185 cm-1), as a proof of polypyrrole and silver (I) ion forming a π complex. That is, if the control electrical field is increased, the strength of the CH expansion/contraction vibration band, testifying to the formation of the π complex, is decreased, while the strength of the N+H expansion/contraction vibration band, testifying to the formation of the σ complex, is increased, as shown in FIG. 12.

From the above fact, it is presumably the transition from the state where the π complex is predominant to the state where the σ complex is predominant that accounts for the increased current density Ids of the current flow through the polypyrrole film 22 such as may be observed when the electrical field Vg applied to the field effect molecular device 21 is increased. It may also be presumed that electrical conductivity of the polypyrrole film 22 may be improved more preeminently in a state where the σ complex has been formed than in a state where the π complex has been formed.

Figure 13A:
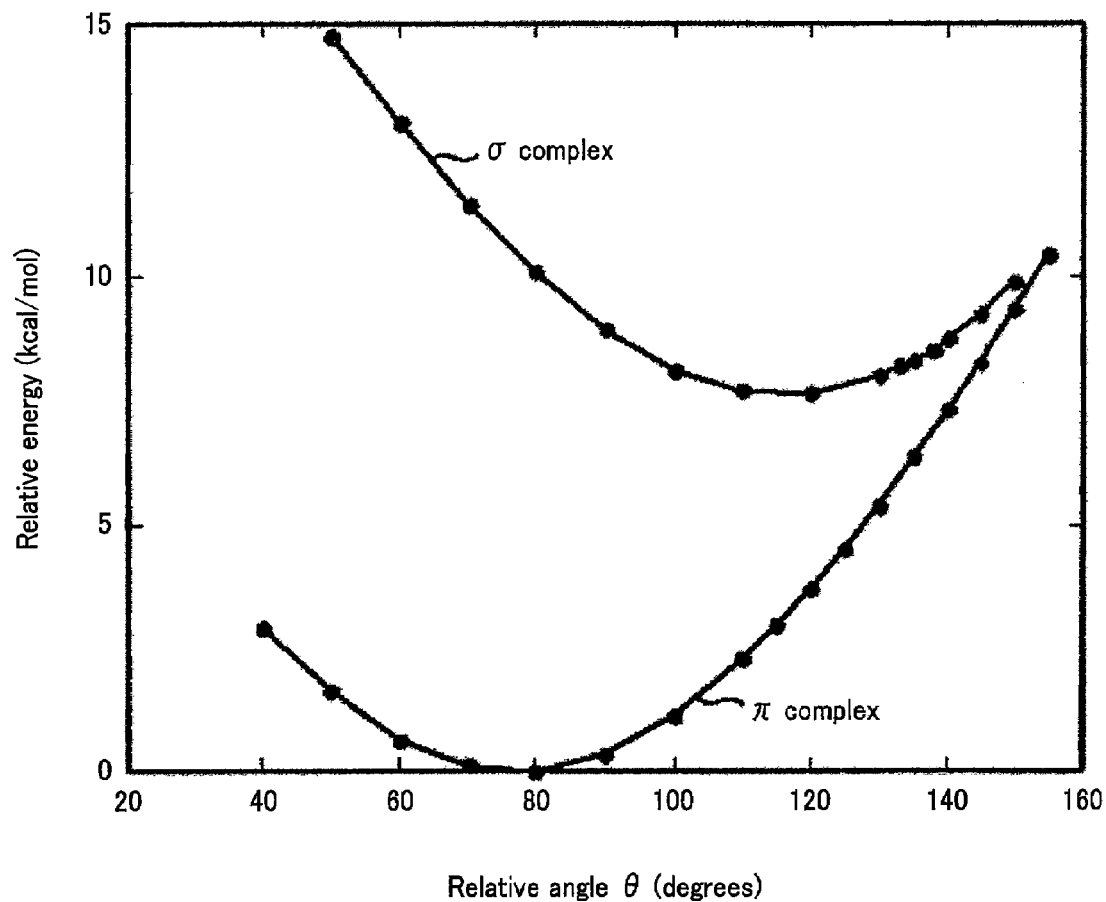
FIGS. 13A and 13B are graphs showing the relationship between the energy of the σ complex and the π complex in a field effect molecular device (theoretical calculated value) and the relative angle θ between a pyrrole ring and a 5CB pendant part.
Figure 13B:
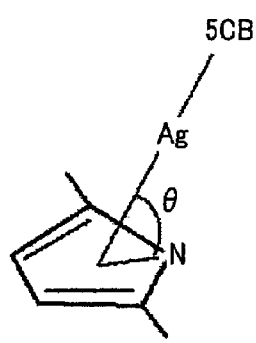

FIG. 13A shows the results of the theoretical calculations of the energy of the σ complex and the π complex for which the two complexes exhibit structural stability. Those theoretical calculations were made as the relative angle θ between the 5CB pendant and the pyrrole ring was changed. From the results of the calculations, it has become apparent that both the π complex and the σ complex may exist in stability, and that the π complex may be more stable than the σ complex by approximately 10 kcal/mol in case the pendant part is at the relative angle θ with respect to the pyrrole ring which may realize the lowest energy possible in each of the complexes. It may therefore be contemplated that, in case no electrical field is applied, the π complex exists more prevalently than the σ complex.

However, it has also become apparent that, when the relative angle θ between the pendant part and the pyrrole ring is increased, the energy difference between the π complex and the σ complex is progressively decreased, and that, when the angle θ becomes greater than 150°, the σ complex and the π complex have approximately the same energy. This means that, in case a larger value of the relative angle θ is imposed by an externally applied force, transition from the π complex to the σ complex may possibly be induced.

Figure 14:
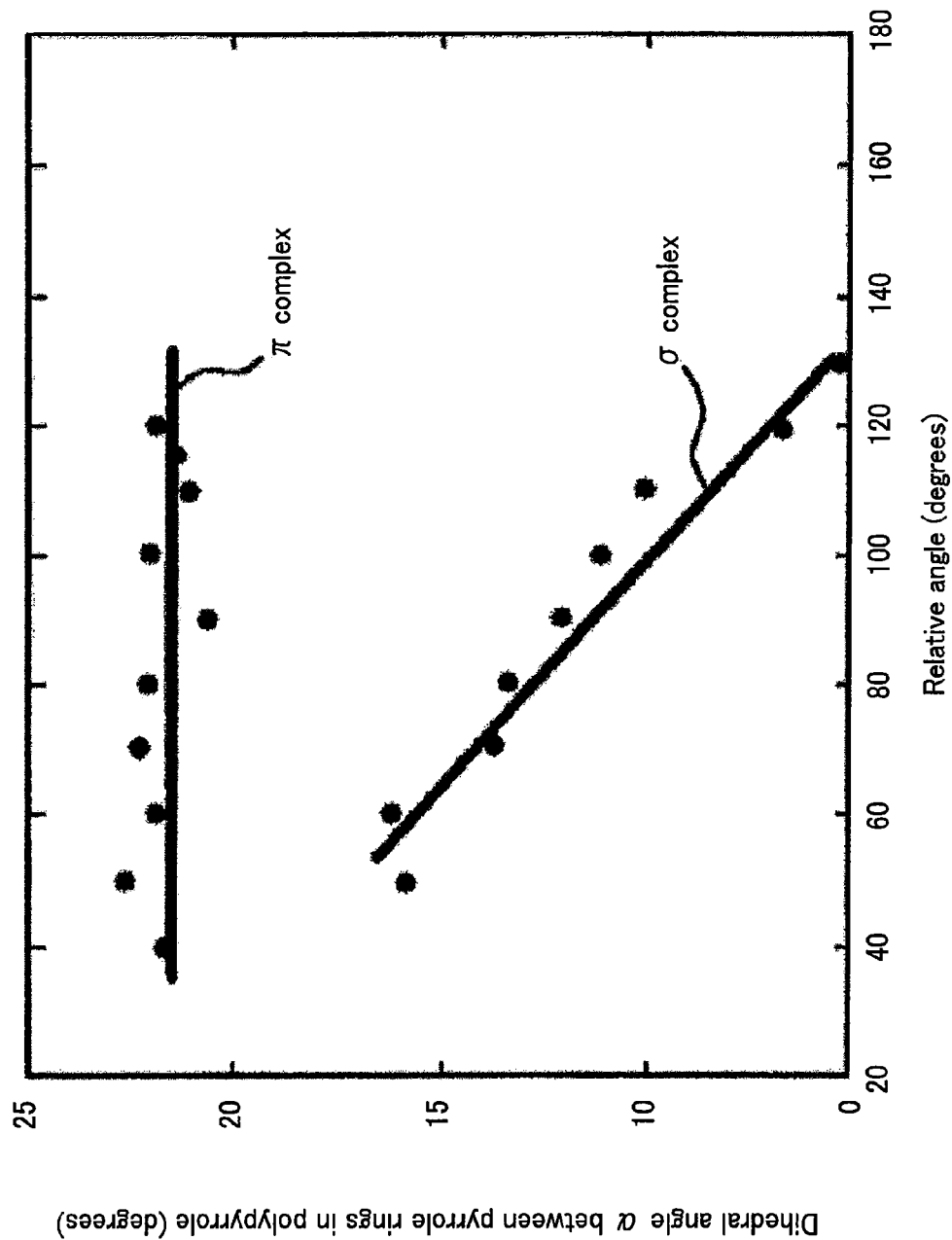
FIG. 14 is a graph showing the relationship between the relative angle θ and the dihedral angle α between pyrrole rings of the σ complex and the π complex in the field effect molecular device.

FIG. 14 shows the results of theoretical calculations for finding the relationship between the dihedral angle between pyrrole rings in the σ complex and the π complex (the angle the plane of the pyrrole ring forming the complex of interest and the plane of the neighboring pyrrole ring) and the relative angle θ the pendant part makes with the pyrrole ring. The results of the calculations indicate that, with the π complex, the dihedral angle α between the pyrrole rings is scarcely dependent on the relative angle θ and exceeds 20° at all times. If the dihedral angle α between the pyrrole rings is that large, the relationship of conjugation between the pyrrole rings is impaired, so that the electrical conductivity through the entire conjugated system is also impaired, thus setting a state of high resistance.

Figure 15A:
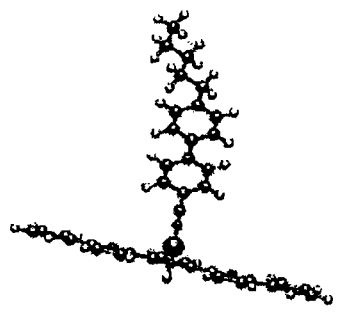
FIGS. 15A and 15B show molecular models illustrating the low resistance state and the high resistance state of the σ complex in the field effect molecular device, respectively.
Figure 15B:
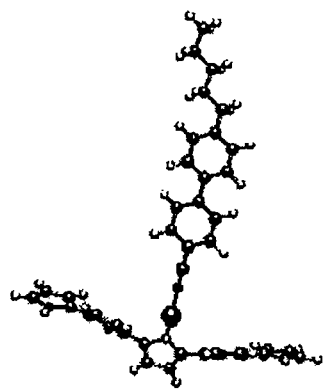

In contrast, with the σ complex, the energy of distortion between the pyrrole rings and the dihedral angle is changed appreciably with changes in the relative angle θ. FIGS. 15A and 15B show molecular models for indicating the low resistance state and the high resistance state in the σ complex, respectively. If the relative angle θ is 130°, for example, as shown in FIG. 15A, the dihedral angle α is 5°, from FIG. 14, with the orientations of the two pyrrole rings being substantially coincident with each other. Thus, the relationship of conjugation between the pyrrole rings is not lost, and hence the electrical conductivity throughout the conjugated system is optimum, with the resistance value being low. If, on the other hand, the relative angle θ is 50°, for example, as shown in FIG. 15B, the dihedral angle α is 17°, as may be seen from FIG. 14, with the orientations of the pyrrole rings differing appreciably from each other. Thus, the relationship of conjugation between the pyrrole rings is impaired, and hence the electrical conductivity throughout the conjugated system is also impaired, with the resistance value being high.

The above depicted results of the theoretical calculations may be summarized as follows: In an ordinary state when no electrical field is applied, the π complex, having a high electrical resistance, exists prevalently. However, if a larger relative angle θ is imposed by an externally applied force, transition from the π complex to the σ complex may be induced. In addition, the σ complex has a small dihedral angle between the pyrrole rings, and exhibits optimum electrical conductivity throughout the conjugated system, with the resistance value being low.

The above-described results of theoretical calculations are coincident with predictions obtained from measurements of the infrared absorption spectrum. By combining the two, it may be concluded that the increased current density Ids of the current flow through the polypyrrole film 22, noticed as the electrical voltage Vg applied to the field effect molecular device 21 is increased, may be attributed to the fact that the 4-pentyl-4'-cyanobiphenyl (5CB) molecule is changed in orientation due to increase of the applied electrical field Vg. The relative angle θ between the pendant part and the pyrrole ring is then increased to induce transition from the π complex to the σ complex, as well as to decrease the dihedral angle α, with the result that the electrical conductivity of the pyrrole chain is modulated from the high resistance state to the low resistance state.

Figure 16:
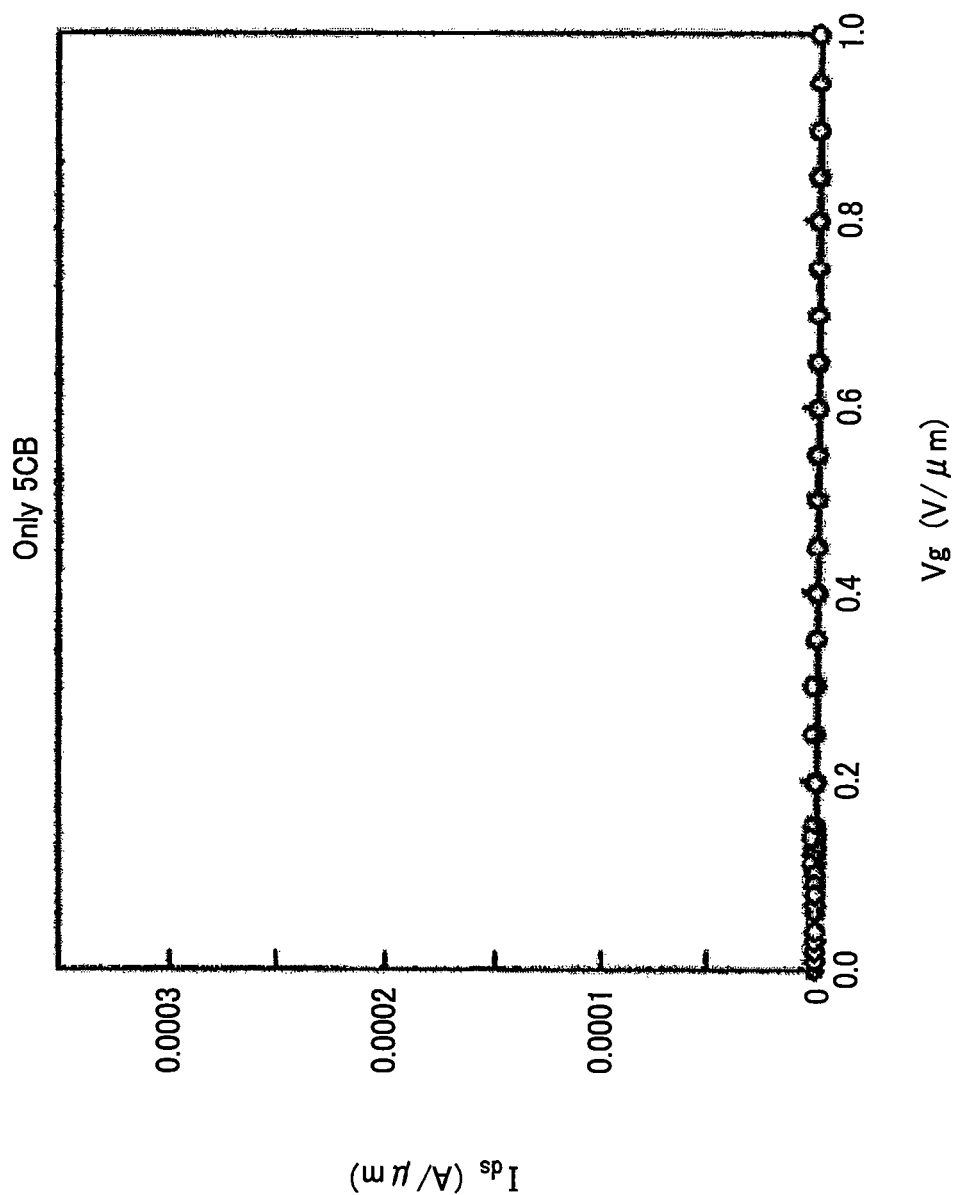
FIG. 16 is a graph showing the relationship between the applied electrical field and the current density in a pseudo field effect molecular device of the Comparative Example of the present application.

For comparison, a pseudo field effect molecular device, not containing a polypyrrole film nor a silver (I) ion, was fabricated in the same way as described above, except not forming the polypyrrole film and substituting 4-pentyl-4'-cyanobiphenyl, by itself, injected into the space between the two substrates, for the 4-pentyl-4'-cyanobiphenyl-silver (I) complex. Then, changes in the current density were measured, as the control electrical field was changed, in the same way as described above, in order to check for electrical conductivity of the so produced structure. There were noticed no changes ascribable to application of the electrical field, as shown in FIG. 16. Meanwhile, the indication 'only 5CB' in the top part of FIG. 16 is intended for specifying the component of the pseudo field effect molecular device. The same holds for the following parts of the present specification.

Figure 17:
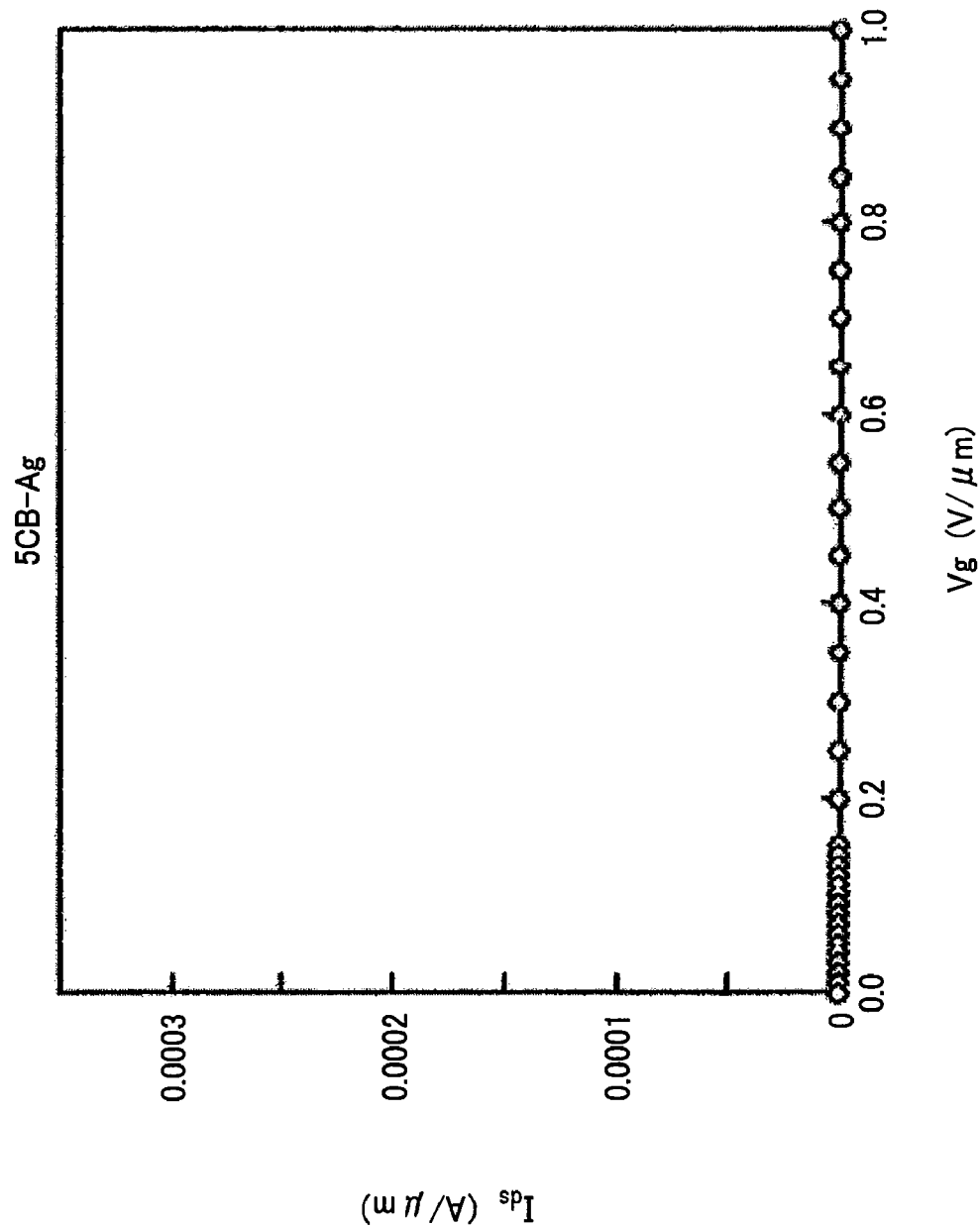
FIG. 17 is a graph showing the relationship between the applied electrical field and the current density in a pseudo field effect molecular device.

For comparison, a pseudo field effect molecular device, not containing the polypyrrole film, was fabricated in the same way as described above, except not fabricating the polypyrrole film. Specifically, the pseudo field effect molecular device was fabricated as a 4-pentyl-4'-cyanobiphenyl-silver (I) complex was injected into the space between the two substrates. In the same way as described above, changes in the current density were measured as the control electrical field applied was changed, in order to check for the electrical conductivity of the so produced structure. There were noticed no changes ascribable to application of the electrical field, as shown in FIG. 17.

Figure 18:
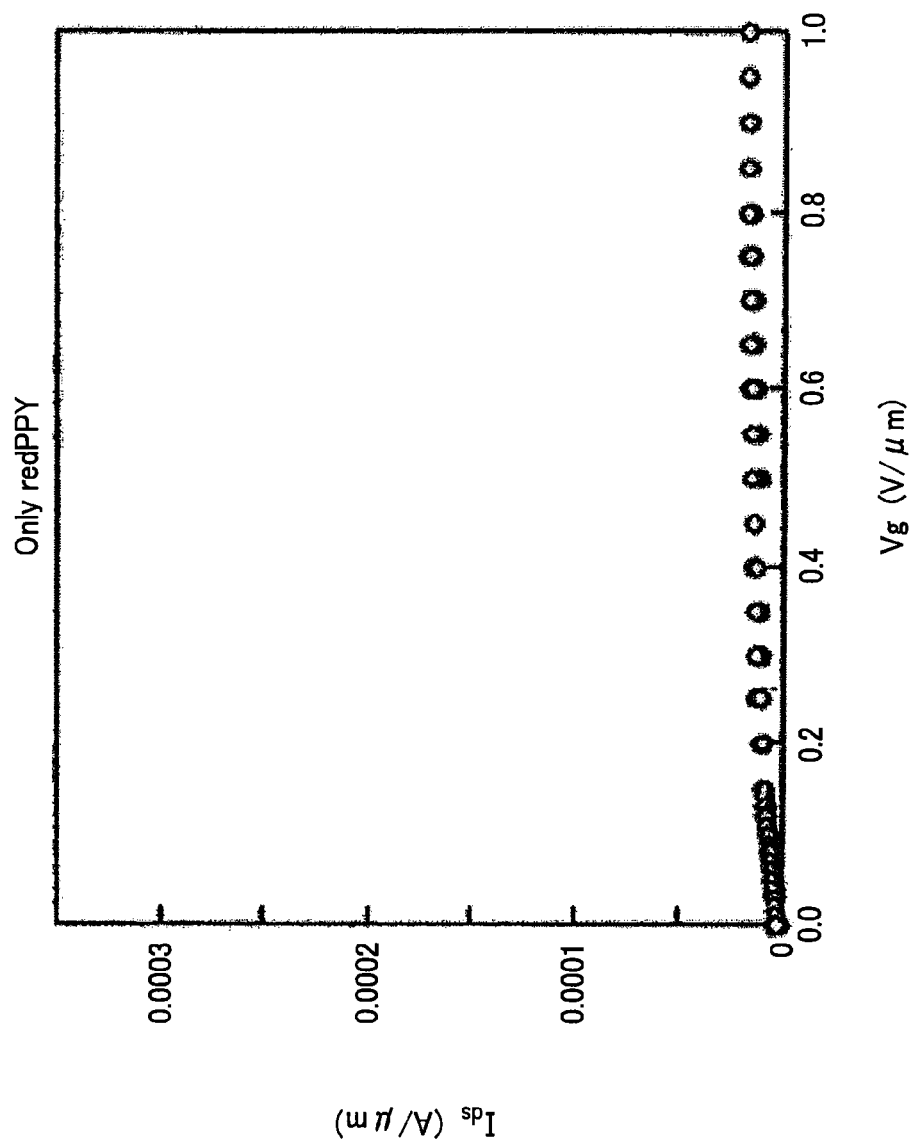
FIG. 18 is another graph showing the relationship between the applied electrical field and the current density in a pseudo field effect molecular device.

Again, for comparison, a pseudo field effect molecular device was fabricated in the same way as described above, except reducing the polypyrrole film fabricated, and also except not injecting a 4-pentyl-4'-cyanobiphenyl-silver (I) complex into the space between the two substrates. In the same way as described above, changes in the current density were measured as the control electrical field applied was changed, in order to check for the electrical conductivity of the so produced structure. There were noticed no change ascribable to application of the electrical field, as shown in FIG. 18. Meanwhile, the indication 'redPPy', as entered in FIG. 18, denotes 'reduced polypyrrole film', as in Comparative Example which will be explained later.

Figure 19:
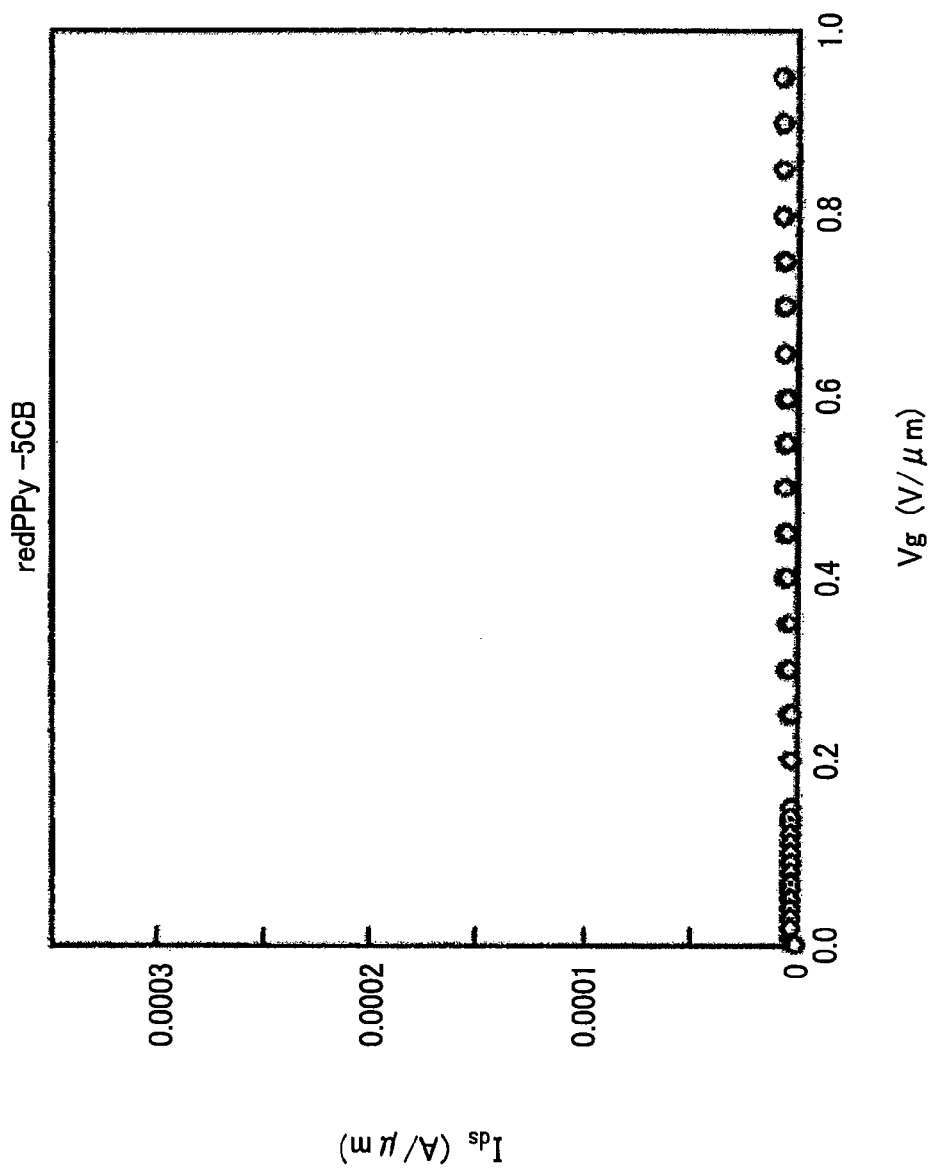
FIG. 19 is yet another graph showing the relationship between the applied electrical field and the current density in a pseudo field effect molecular device.

Similarly, for comparison, a pseudo field effect molecular device was fabricated in the same way as described above, except reducing the as-fabricated polypyrrole film, and also except substituting 4-pentyl-4'-cyanobiphenyl, by itself, for a 4-pentyl-4'-cyanobiphenyl-silver (I) complex, as injected into the space between the two substrates. In the same way as described above, changes in the current density were measured, as the control electrical field applied was changed, in order to check for the electrical conductivity of the so produced structure. There were noticed no change ascribable to application of the electrical field, as shown in FIG. 19.

It may be seen from comparison with the above Comparative Examples that electrical conductivity of the polypyrrole film plays a crucial part in the modulation of the electrical conductivity of the field effect molecular device, brought about by application of the electrical field, and that the 4-pentyl-4'-cyanobiphenyl-silver (I) complex is taking part in the electrical conductivity.

<I-V Characteristics of Type II Field Effect Molecular Device>

A field effect molecular device 21 was fabricated in the same way as described above, except that pre-processing of applying a high frequency electrical field (10 kHz, 100V, one hour) to the polypyrrole-silver (I)-5CB complex, fabricated in the same way as in the above Example, was carried out prior to use of the device. The time for application of the electrical field for pre-processing of ten minutes or longer is sufficient.

The electrical field Vg, applied across the electrodes for application of the control electrical field 31, 36 of the field effect molecular device 21, obtained on pre-processing, as described above, was increased gradually from zero, and measurements were made of the current density Ids of the current flowing through the polypyrrole film 22, disposed between the comb-shaped electrodes 33, 34, under an A.C. bias voltage. There was noticed the action of modulation in which the current density Ids is high as long as the electrical field Vg is off and in which the current density Ids is progressively decreased with increase in the electrical field Vg applied. In case the electrical field applied is then progressively decreased, the current density is increased, however, the hysteresis phenomenon was noticed. The above I/V characteristics are proper to the above-mentioned type II gate.

Figure 20:
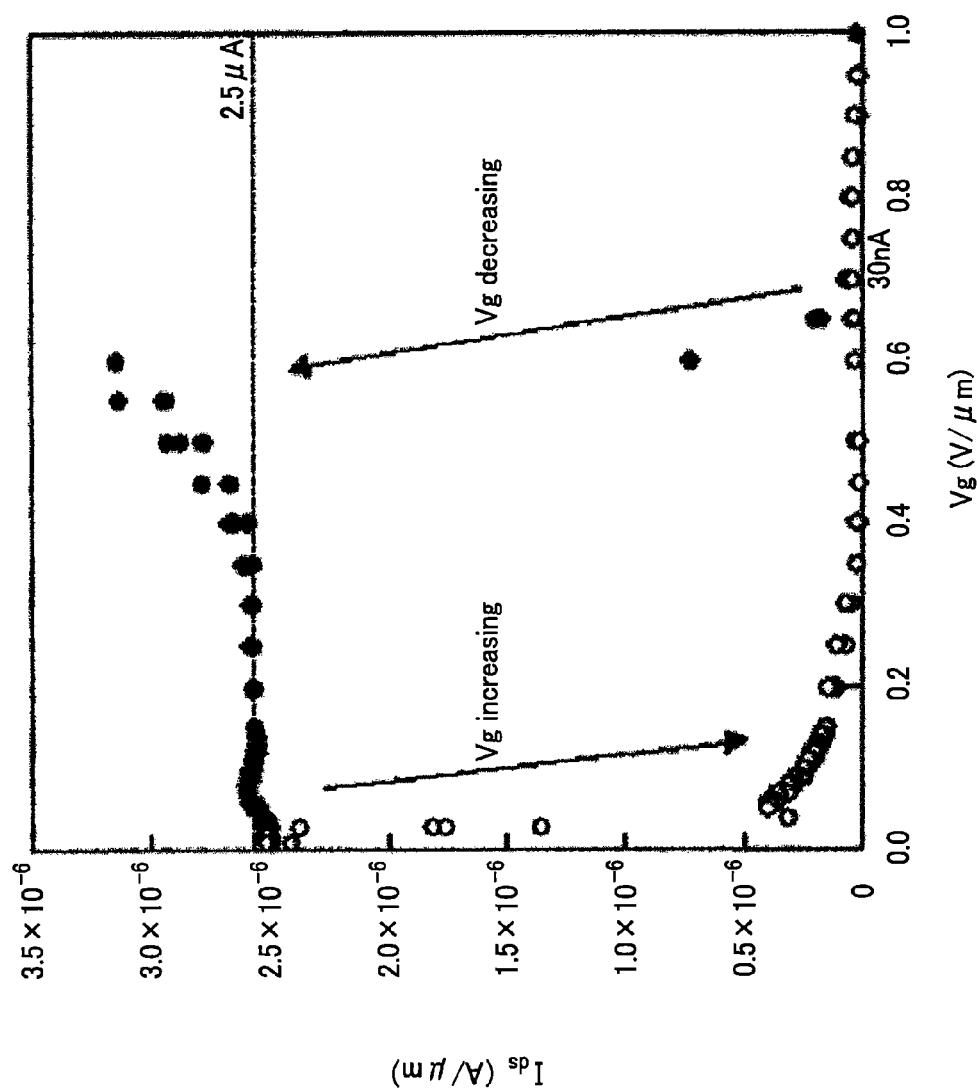
FIG. 20 is a graph showing the relationship between the current density of the current flowing between comb-shaped electrodes and the strength of the applied electrical field in a type II field effect molecular device according to the present application.

FIG. 20 depicts a graph showing the relationship between the magnitude of the electrical field Vg and the current density Ids in case of application of the high frequency electrical field in the form of a bipolar rectangular wave across the electrodes for application of the control electrical field 31, 36 of the field effect molecular device 21.

The above action of modulation has the propensity which is the reverse of that noticed with the type I gate. The magnitude itself of the current density Ids also differs appreciably from that for the type I gate. Thus, the possibility of modifying the electrical conductivity of the field effect molecular device by the pre-processing consisting in applying the high frequency electrical field has been shown. The reason is possibly such that a metal (silver) ion is oxidized and reduced under the high frequency electrical field, thus leading to decomposition of the above-described complex.

A measurement cell for measuring the infrared absorption spectrum was fabricated from the same materials as those of the field effect molecular device 21, in order to clarify the above-described operating mechanism of the effect of application of the electrical field based on the measurement of the infrared absorption spectrum. The measurement cell was fabricated in the same way as in the case of the type I except using calcium fluoride substrates as the first and second substrates 31, 35, providing transparent electrodes, formed by transparent electrically conductive films, as the electrodes for application of the control electrical field, and not providing the comb-shaped electrodes 33, 34.

Figure 21A:
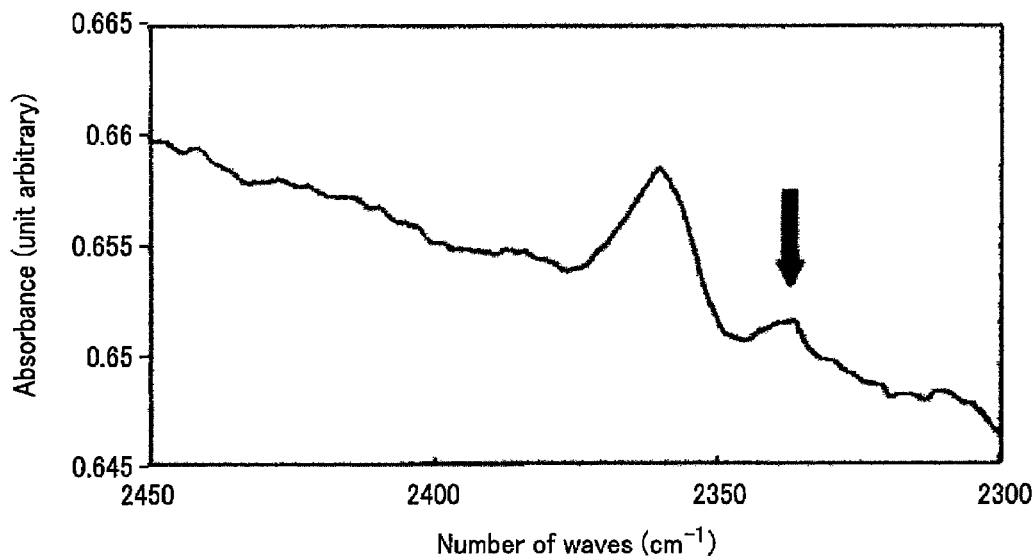
FIGS. 21A and 21B are graphs showing the infrared absorption spectra prior to and subsequent to application of a high frequency electrical field for pre-processing a light absorption spectrum measurement cell formed of the same materials as those of the field effect molecular device, respectively.
Figure 21B:
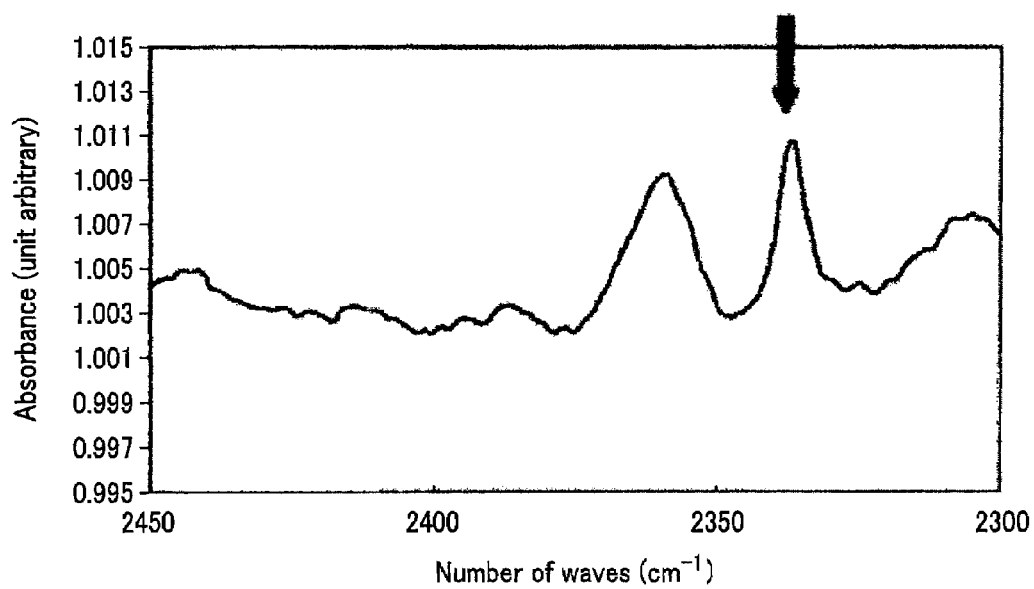

FIGS. 21A, 21B depict graphs showing an infrared light absorption spectrum of the measurement cell for measuring the infrared absorption spectrum before and after application of the high frequency electrical field for pre-processing. Before application of the high frequency electrical field for pre-processing, the N+H expansion/contraction vibration band (2337 cm-1), testifying to the formation of the σ complex from the polypyrrole and silver (I) ion, is rather weak, as shown in FIG. 21A. Conversely, after application of the high frequency electrical field for pre-processing, the N+H expansion/contraction vibration band (2337 cm-1), testifying to the formation of the σ complex from the polypyrrole and silver (I) ion, was noticed with high strength, as shown in FIG. 21B. On the other hand, there was scarcely noticed the CH expansion/contraction vibration band (3185 cm-1), testifying to the formation of the π complex.

<CMOS Inverter>

Figure 22:
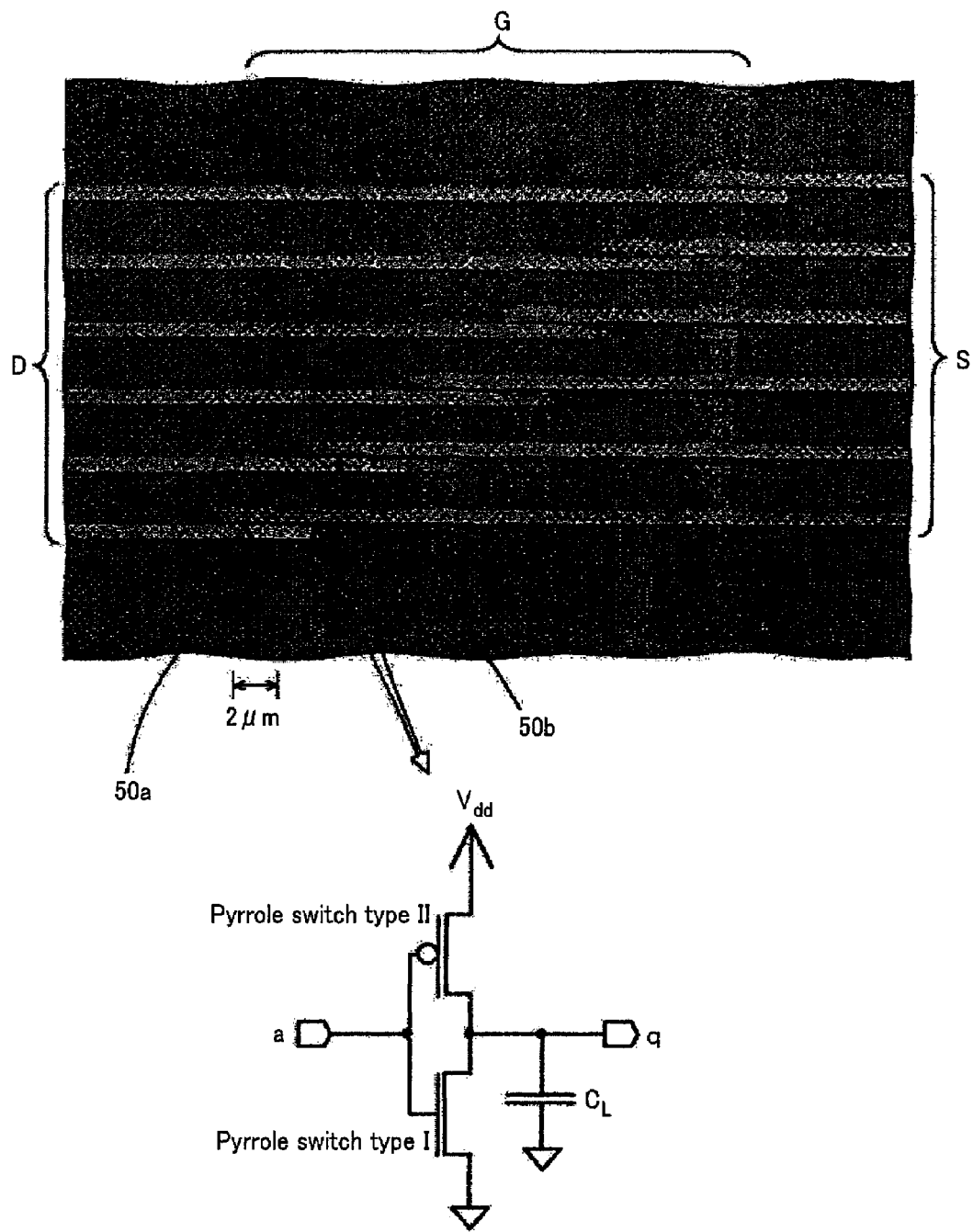
FIG. 22 is a schematic plan view and an equivalent circuit diagram of a CMOS inverter embodying the present application.
Figure 23A:
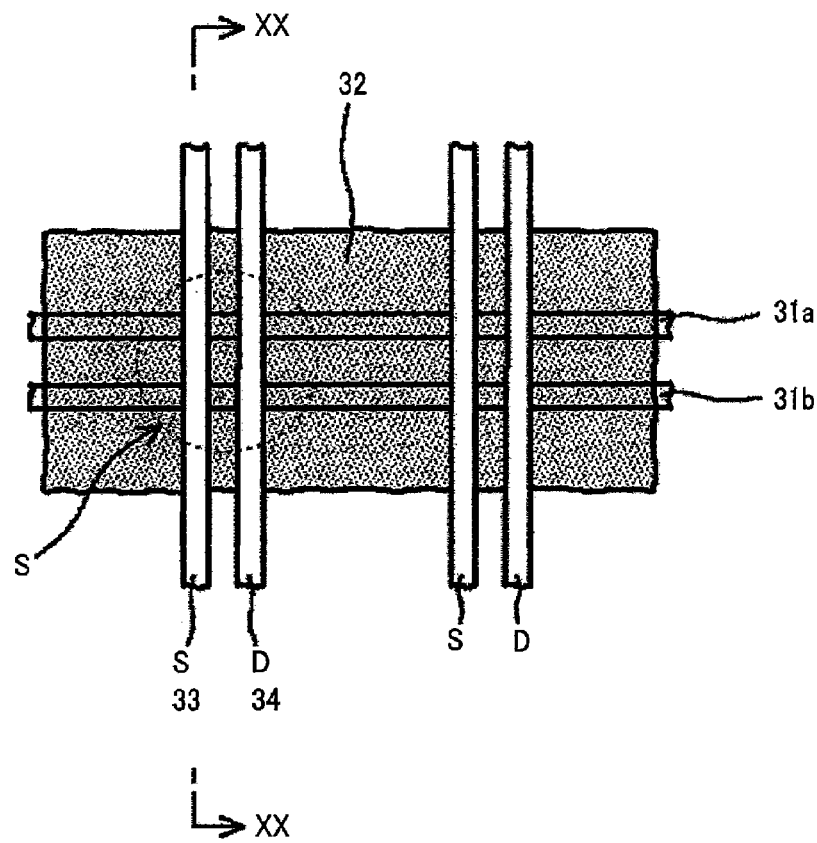
FIG. 23A is a plan view showing essential parts of a CMOS inverter.
Figure 23B:
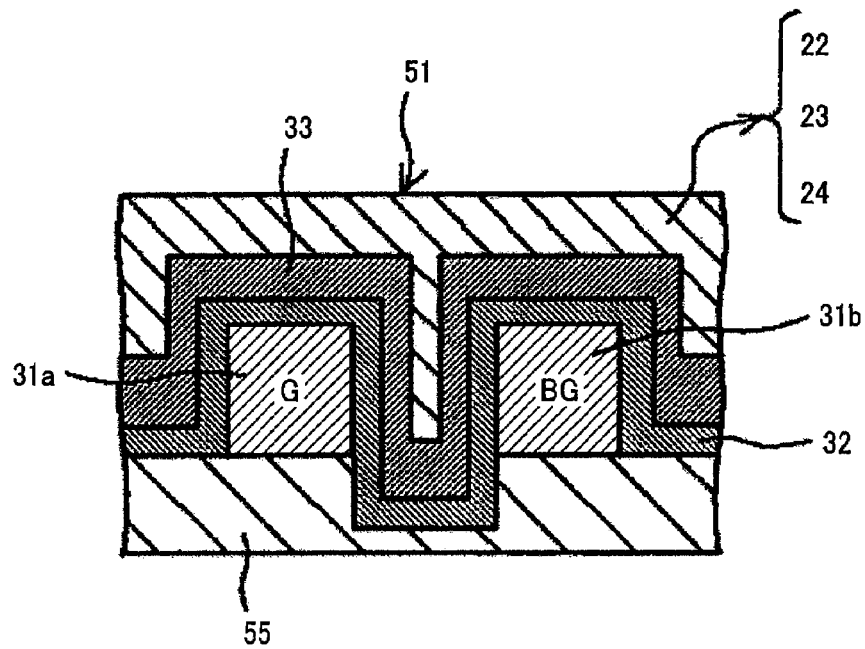
FIG. 23B is a cross-sectional view taken along line XX-XX of FIG. 23A.

Referring to FIGS. 22, 23A and 23B, an insulating layer (SiO$_2$) 32 was formed in a space defined by larger numbers of juxtaposed source electrodes S(33) and drain electrodes D(34) and larger numbers of gate electrodes G (31a, 31b) lying at right angles thereto. The aforementioned polypyrrole-silver (I)-5CB complex was injected on an upper substrate surface to form a channel region 51. A larger number of CMOS inverters were formed with the intersections of the sets of the source electrodes S and the drain electrodes D with the gate electrodes G as type I gates (switch part S) 50a and as type II gates (switch part S) 50b, respectively. This method for fabrication is similar to the method described above in connection with the field effect molecular device and hence is not here described in detail. The type II gate was pre-processed by applying a high frequency voltage of 10 kHz, 100V and one hour to the gate electrodes.

Figure 24A:
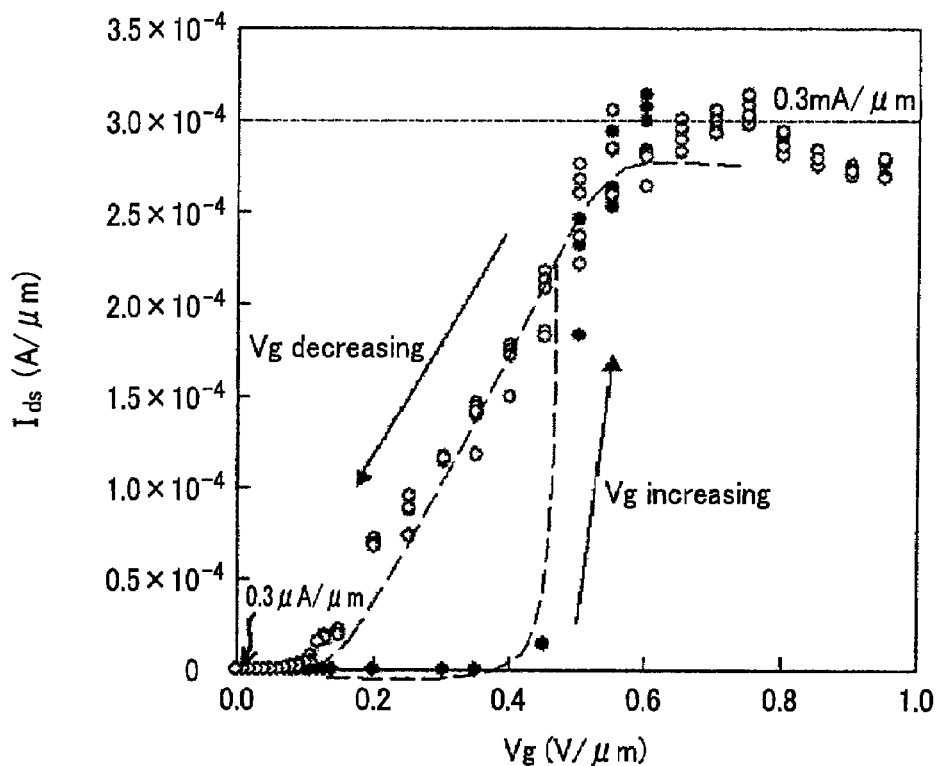
FIGS. 24A and 24B are graphs showing changes in electrical conductivity of the type I and type II field effect molecular devices, brought about as a result of voltage application, respectively.
Figure 24B:
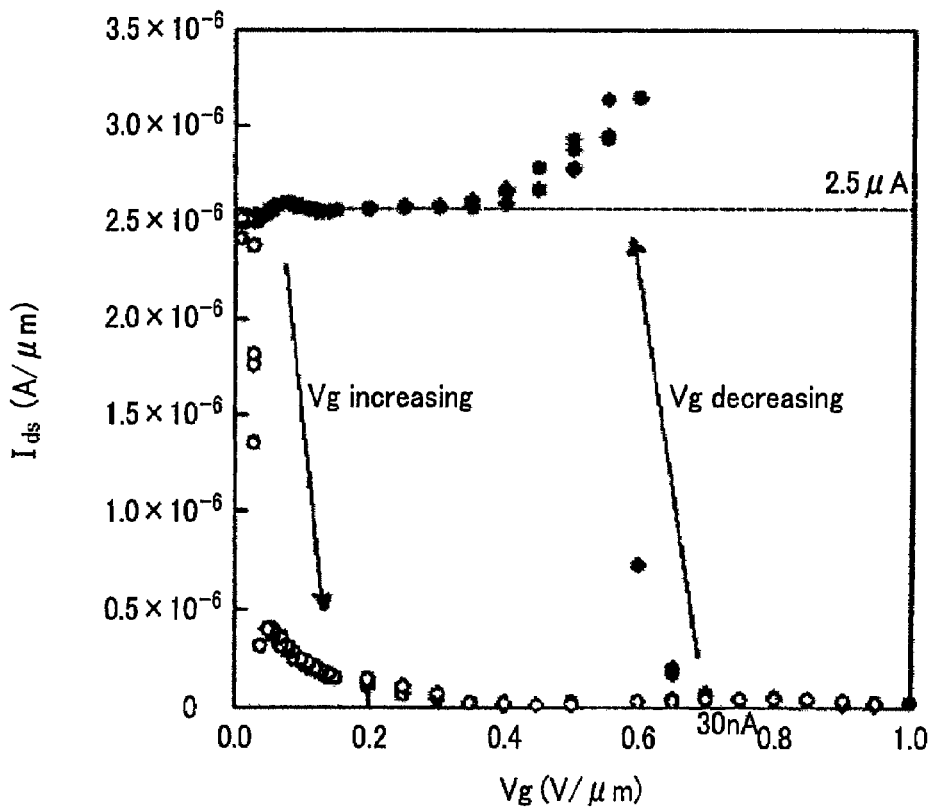

FIGS. 24A and 24B depict graphs showing I-V characteristics of the respective gates of the present inverter. In case the input a is set to 0V, a pyrrole switch I is OFF, while a pyrrole switch II is ON. An output q is pulled by the pyrrole switch II to VDD so that a signal of 10 kHz and 1V is output. In case the input a is set to a signal of 10 kHz and 1V, the pyrrole switch I is ON, while a pyrrole switch II is OFF. The output q is pulled by the pyrrole switch I to the ground so that a signal of 0V is output.

Since the channel part is formed with a compound (complex), the π electron conjugated system of which is changed by changes in the molecular structure, induced by the electrical field, the electrical characteristics of the functional molecular device, such as electrical conductivity, may be obtained by the π electron conjugated system. Additionally, the electrical characteristics, thus obtained, may be modulated by changes in the molecular structure induced by changes in the electrical field.

A plural number of the gates, each formed by a channel part, a gate electrode, a source electrode and a drain electrode, formed of the compounds of the above-described functional molecular element, may be interconnected to constitute an integrated circuit, in particular a logic circuit gate. More specifically, in the gate not subjected to electrical field processing, out of the aforementioned plural gates, the current flowing through the source and the drain is increased against the applied gate voltage, whereas, in the gate subjected to electrical field processing, the current flowing through the source and the drain is decreased against the applied gate voltage, so that the gates of the two sorts display respective different characteristics. Hence, these two sorts of the gates may be connected together to form a molecular transistor, which favorably compares with the so-called mos, from the same materials. The present application may also be applied not only to the CMOS inverter, described above, but also to a large variety of logic gate circuits.

Although the present application has so far been explained with reference to the preferred embodiments, the present application is not limited to the particular configurations of these embodiments. It will be appreciated that the present application may encompass various changes or corrections such as may readily be arrived at by those skilled in the art within the scope and the principle of the application.

INDUSTRIAL APPLICABILITY

According to the present application, a plural number of the gates, formed by functional molecular elements, which are based on the above-described novel operating mechanism of the electrical field, may be interconnected for application to a variety of electronic devices, such as switches, transistors, memories or logic circuits. The electronic devices of a wide size range from a conventional macro-sized element to a nanometer-size element, may be fabricated, using the same material and based on the same principle.

It should be understood that various changes and modifications to the presently preferred embodiments described herein will be apparent to those skilled in the art. Such changes and modifications can be made without departing from the spirit and scope of the present application and without diminishing its intended advantages. It is therefore intended that such changes and modifications be covered by the appended claims.

The invention claimed is:

1. A functional molecular device comprising:
a plural number of gates connected together;
each of said gates being formed by a channel part, formed of a compound having a π electron conjugated system changed by changes in a molecular structure induced by an electrical field, electrical field applying means for applying said electrical field, and output means for taking out an output corresponding to said electrical field through said channel part,
said gates displaying respective different electrical characteristics by said electrical field, wherein
said channel part includes a molecule exhibiting dielectric constant anisotropy and/or dipole moment, a metal ion and a molecule of the conjugated system,
said metal ion, said molecule exhibiting dielectric constant anisotropy and/or dipole moment, and said molecule of the conjugated system form a complex,
said electrical field applying means applying an electrical field to said molecule exhibiting dielectric constant anisotropy and/or dipole moment; and input means being for said molecule of the conjugated system.

2. The functional molecular device according to claim 1 wherein a logic gate circuit is formed by a plurality of said gates.

3. The functional molecular device according to claim 2 wherein said logic gate circuit is formed as an inverter formed by a plurality of said gates displaying respective different channel resistance values by said electrical field.

4. The functional molecular device according to claim 1 wherein said input means inputs electrons.

5. The functional molecular device according to claim 1 wherein said molecules exhibiting dielectric constant anisotropy and/or dipole moment are arrayed on electrodes adapted for applying said electrical field, said metal ions and the molecules of said conjugated system are arrayed between facing electrodes, and the output corresponding to said electrical field is taken out from at least one of said facing electrodes.

6. The functional molecular device according to claim 5 wherein an electrically conductive path is formed by said molecules of the conjugated system, and said electrically conductive path has electrical conductivity controlled by changes in said electrical field acting on said molecules exhibiting dielectric constant anisotropy and/or dipole moment.

7. The functional molecular device according to claim 6 wherein, in a specified one of said plural gates, a high frequency electrical field is applied to said complex prior to application of said electrical field to change the electrical conductivity of said electrically conductive path of said specified gate.

8. The functional molecular device according to claim 6 wherein the position relationship of said molecule exhibiting dielectric constant anisotropy and/or dipole moment with respect to the direction of the electrical field is changed by changes in said electrical field acting on said molecule exhibiting dielectric constant anisotropy and/or dipole moment whereby an angle said molecule makes with said molecule of the conjugated system, a site of action of said metal ion or a three-dimensional structure of said complex is changed.

9. The functional molecular device according to claim 6 wherein a layer of said conjugated system and a layer of said molecule exhibiting dielectric constant anisotropy and/or dipole moment form a stack.

10. The functional molecular device according to claim 9 wherein an insulating layer is provided on a first electrode, second and third electrodes are formed on said insulating layer in a manner free of contact with one another, said stack is arranged at least between said second and third electrodes, and a fourth electrode is provided, either directly or via an insulating layer, on a layer of said molecule exhibiting dielectric constant anisotropy and/or dipole moment of said stack.

11. The functional molecular device according to claim 1 wherein said molecule exhibiting dielectric constant anisotropy and/or dipole moment is a Louis base molecule.

12. The functional molecular device according to claim 1 wherein said metal ion is a Louis acid.

13. The functional molecular device according to claim 1 wherein said molecule exhibiting dielectric constant anisotropy and/or dipole moment has orientation changed under the action of an electrical field.

14. The functional molecular device according to claim 13 wherein said molecule exhibiting dielectric constant anisotropy and/or dipole moment has orientation changed under the action of an electrical field to cause changes in electrical conductivity of said molecule of the conjugated system.

15. The functional molecular device according to claim 1 wherein said molecule of the conjugated system is polypyrrole.

16. The functional molecular device according to claim 1 wherein said molecule exhibiting dielectric constant anisotropy and/or dipole moment is 4-pentyl-4'-cyanobiphenyl.

17. The functional molecular device according to claim 1 wherein said metal ion is silver ion.

* * * * *